(12) United States Patent
Sato et al.

(10) Patent No.: US 9,398,688 B2
(45) Date of Patent: Jul. 19, 2016

(54) ELECTROCONDUCTIVE STACK BODY AND DISPLAY BODY EMPLOYING THE SAME

(71) Applicant: TORAY INDUSTRIES, INC., Tokyo (JP)

(72) Inventors: Yoshikazu Sato, Otsu (JP); Shozo Masuda, Otsu (JP); Ozora Yoshino, Otsu (JP); Osamu Watanabe, Otsu (JP)

(73) Assignee: Toray Industries, Inc., Tokyo (JP)

( * ) Notice: Subject to any disclaimer, the term of this patent is extended or adjusted under 35 U.S.C. 154(b) by 107 days.

(21) Appl. No.: 14/358,959

(22) PCT Filed: Nov. 26, 2012

(86) PCT No.: PCT/JP2012/080439
§ 371 (c)(1),
(2) Date: May 16, 2014

(87) PCT Pub. No.: WO2013/080908
PCT Pub. Date: Jun. 6, 2013

(65) Prior Publication Data
US 2014/0305682 A1    Oct. 16, 2014

(30) Foreign Application Priority Data

Nov. 29, 2011 (JP) .................................. 2011-259867

(51) Int. Cl.
*H05K 1/02* (2006.01)
*H05K 3/10* (2006.01)
(Continued)

(52) U.S. Cl.
CPC ............... *H05K 1/0296* (2013.01); *C08K 3/00* (2013.01); *H01B 1/22* (2013.01); *H05K 1/0274* (2013.01);
(Continued)

(58) Field of Classification Search
CPC ..... H05K 1/0296; H05K 1/0274; H05K 3/10; Y10S 977/932; B82Y 99/00; C08K 3/00; H01B 1/22

USPC ........... 174/253, 255, 250; 427/99.2; 977/932
See application file for complete search history.

(56) References Cited

U.S. PATENT DOCUMENTS

| 2010/0206628 A1* | 8/2010 | Matsui | ................... H01J 11/10 174/389 |
| 2011/0142091 A1* | 6/2011 | Wardle | ................... B82Y 15/00 374/45 |

FOREIGN PATENT DOCUMENTS

| JP | 61-245413 A | 10/1986 |
| JP | 2006-111675 A | 4/2006 |
| JP | 2009-129607 A | 6/2009 |
| JP | 2009-302035 A | 12/2009 |

(Continued)

OTHER PUBLICATIONS

International Search Report for PCT International Application No. PCT/JP2012/080439 dated Dec. 18, 2012.

*Primary Examiner* — Timothy Thompson
*Assistant Examiner* — Charles Pizzuto
(74) *Attorney, Agent, or Firm* — RatnerPrestia

(57) ABSTRACT

An electroconductive stack body having on at least one side surface of a substrate an electroconductive layer that has a network structure that is made by a linear structural body, wherein, an opening portion that satisfies Expression (1) in an opening area of an opening portion that is formed by the network structure, average value A of the opening area is less than or equal to 20 $\mu m^2$ and variation deviation σ of the opening area defined by Expression (2) is less than or equal to 26 $\mu m^2$:

| $X < X_{max} \times 0.9$ | Expression (1) |
| $\sigma = \{\Sigma(X-A)^2)/N\}^{0.5}$ (wherein for $\Sigma$, $i=1$ to $N$) | Expression (2) | wherein in the expressions, X represents each of the opening areas of the opening portions that satisfy Expression (1), $X_{max}$ represents the maximum value of each opening area, A represents the average value of the opening areas X, and N represents the total number of the opening portions that satisfy Expression (1).

9 Claims, 3 Drawing Sheets

(51) Int. Cl.
    *C08K 3/00*     (2006.01)
    *H01B 1/22*     (2006.01)
    *H01L 51/52*     (2006.01)
    *B82Y 99/00*     (2011.01)

(52) U.S. Cl.
    CPC . *H05K 3/10* (2013.01); *B82Y 99/00* (2013.01); *C08K 2201/001* (2013.01); *H01L 51/5215* (2013.01); *Y10S 977/932* (2013.01)

(56) References Cited

FOREIGN PATENT DOCUMENTS

| | | |
|---|---|---|
| JP | 2010-087120 A | 4/2010 |
| JP | 2011-082092 A | 4/2011 |
| JP | 2011-119142 A | 6/2011 |
| JP | 2011-192396 | 9/2011 |
| WO | WO2010/129604 A1 | 11/2010 |
| WO | WO 2011/081023 A1 | 7/2011 |

\* cited by examiner

ELECTROCONDUCTIVE STACK BODY AND DISPLAY BODY EMPLOYING THE SAME

CROSS REFERENCE TO RELATED APPLICATIONS

This is the U.S. National Phase application of PCT/JP2012/080439, filed Nov. 26, 2012, which claims priority to Japanese Patent Application No. 2011-259867, filed Nov. 29, 2011, the disclosures of each of these applications being incorporated herein by reference in their entireties for all purposes.

FIELD OF THE INVENTION

The present invention relates to an electroconductive stack body that is good in electroconductivity. More particularly, the present invention relates to an electroconductive stack body which has an electroconductive layer that has a network structure that is made by a linear structural body, and which is good in electroconductivity. Furthermore, the present invention also relates to an electroconductive stack body that is also used as an electrode member that is used in a display-related appliance, such as a liquid crystal display, an organic electroluminescence or an electronic paper, as well as a solar cell module or the like.

BACKGROUND OF THE INVENTION

In recent years, electroconductive members are used for electrodes in display-related appliances, such as touch panels, liquid crystal displays, organic electroluminescences or electronic papers, as well as solar cell modules or the like.

As an electroconductive member there exists one in which an electroconductive layer is stacked on a substrate. As such an electroconductive layer there has been proposed one in which electroconductivity is developed by forming a network structure through the use of a linear electroconductive component, such as a carbon nanotube (hereinafter, abbreviated as CNT), a metal nanowire or a metal nanorod, besides those electroconductive layers that use related-art electroconductive thin films, such as ITO or a metal thin film. For example, an electroconductive stack body in which a layer having CNT as an electroconductive component is stacked on a substrate has been proposed (patent document 1). Furthermore, an electroconductive stack body in which a layer having a metal nanowire as an electroconductive component is stacked has also been proposed (patent document 2). Furthermore, a stack body in which a metal nanorod is used as an electroconductive component and in which arrangement of the metal nanorod has been controlled (patent document 3) has also been proposed. Still further, a stack body in which a protective layer is stacked on an electroconductive layer that contains an electroconductive component that has a linear shape has also been proposed (patent document 4).

PATENT DOCUMENTS

Patent Document 1: Published Japanese Translation of PCT Application No. 2010-516018
Patent Document 2: Japanese Patent Application Publication No. 2009-129607
Patent Document 3: Japanese Patent Application Publication No. 2006-111675
Patent Document 4: Booklet of International Publication No. 2011/081023

SUMMARY OF THE INVENTION

However, as for an electroconductive layer in which CNT is used as in the patent document 1, dispersion is difficult, therefore giving rise to a problem that it is hard to control the network structure and it is difficult to provide an electroconductive stack body that is low in the surface resistance value. Among electroconductive layers in which a metal nanowire that is good in electroconductivity is used as in the patent document 2, one that is merely stacked on a substrate without controlling the dispersed state of the metal nanowire that forms the network structure has difficulty in providing an electroconductive stack body that is low in the surface resistance value, and therefore requires a special processing step when an electroconductive stack body is to be obtained. Furthermore, an electroconductive layer in which the arrangement of metal nanorods is controlled in a specific direction as in the patent document 3 still has a problem of being high in the surface resistance value. Furthermore, if a protective layer is provided as in the patent document 4, the effect of improving the electroconductivity is found low.

Thus, in the case where a material that is linear in shape is used as an electroconductive component, there is a problem that, due to the network structure, the surface resistance value becomes high and therefore sufficient electroconductivity cannot be obtained.

The present invention, in view of the foregoing problems of the related art, is intended to obtain an electroconductive stack body that is good in electroconductivity, by controlling the network structure of an electroconductive component that is linear.

In order to solve the task as mentioned above, the present invention adopts constructions including the following. That is:

(1) A construction that has on at least one side surface of a substrate an electroconductive layer that has a network structure that is made by a linear structural body, wherein, regarding an opening portion that satisfies Expression (1) in an opening area of an opening portion that is formed by the network structure, average value A of the opening area is less than or equal to 20 μm² and variation deviation σ of the opening area defined by Expression (2) is less than or equal to 26 μm².

$$X < X\text{max} \times 0.9 \quad \text{Expression (1)}$$

(in the expression, X represents each opening area, and Xmax represents the maximum value of each opening area.)

$$\sigma = \{\Sigma(X-A)^2)/N\}^{0.5} \text{ (where as for } \Sigma, i=1 \text{ to } N) \quad \text{Expression (2)}$$

(in the expression, X represents each of the opening areas of the opening portions that satisfy Expression (1), A represents the average value of the opening areas X of the opening portions that satisfy Expression (1), and N represents the total number of the opening portions that satisfy Expression (1).)

Furthermore, the electroconductive stack body of the present invention is preferred to satisfy the followings.
(2) That the linear structural body is a silver nanowire.
(3) That the electroconductive layer further includes a compound that has a structure of the following structural expression (1) in a molecule.

[CHEM. 1]

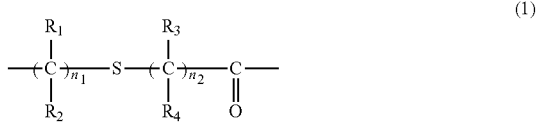

(in the expression, Ra (a=1 to 4) represents H or F. n1 and n2 each independently represent an integer of 1 to 10.)
(4) That the electroconductive layer further includes a high-molecular matrix.

(5) That the aforementioned substrate is a hydrophilic substrate in which a hydrophilic layer that includes a compound having a hydrophilic group is stacked on an outermost layer of at least one side surface.

Furthermore, the present invention also provides a production method including the following.

(6) A production method for the electroconductive stack body described in any one of the foregoing paragraphs (1) to (5), wherein, in a step of forming an electroconductive layer by applying a water-containing dispersion liquid of a linear structural body onto a substrate and then drying the water-containing dispersion liquid, a drying step is a step of causing an air stream whose temperature is 25 to 120° C. to strike a surface on which the water-containing dispersion liquid has been applied, from a direction of 45 to 135° relative to the direction of application.

Furthermore, the present invention provides a display body including the following.

(7) A display body including the electroconductive stack body according to any one of (1) to (5).

(8) A touch panel in which the display body according to claim 7) is incorporated.

(8) An electronic paper in which the display body according to (7) has been incorporated.

According to the present invention, an electroconductive stack body that is good in electroconductivity can be provided.

DETAILED DESCRIPTION OF EMBODIMENTS OF THE INVENTION

[Electroconductive Stack Body]

Figure 1:
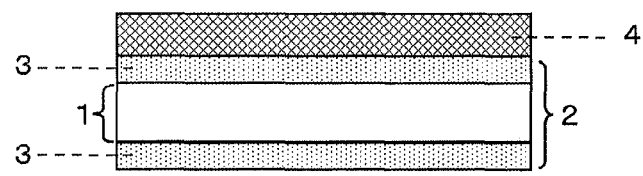
FIG. 1 is a sectional schematic diagram showing an example of the electroconductive stack body of the present invention.

The electroconductive stack body of the present invention preferably has an electroconductive layer on at least one side of a substrate. The electroconductive layer includes a linear structural body that has a network structure. The linear structural body having the network structure works as a so-called electroconductive component to lower the resistance value, so that, as the electroconductive layer, good electroconductivity is developed.

[Linear Structural Body Having Network Structure]

The electroconductive component of the electroconductive layer is a linear structural body that has a network structure. Because the electroconductive component is a linear structure body that has a network structure that is high in electroconductivity, an electroconductive layer whose electroconductivity is excellent for the compounding ratio can be obtained, so that an electroconductive stack body with a low surface resistance value can be obtained.

In the present invention, the linear structural body exists, having a network structure. Because the linear structural body has the network structure, an electroconductive path in a planar direction in the electroconductive layer is formed, so that a low surface resistance value can be obtained. In the present invention, the network structure refers to having such a dispersion structure that when individual linear structural bodies in the electroconductive layers are seen, the average of numbers of contact points of a linear structural body with another linear structural body exceeds at least 1. At this time, the contact point may be contact between any portions of linear structural bodies, that is, terminal end portions of linear structural bodies may contact each other, or a terminal end and a portion of a linear structural body other than a terminal end may contact, or portions of linear structural bodies other than terminal ends may contact each other. Contacting herein may be merely touching or may be being joined at the contact point. Incidentally, of the linear structural bodies in the electroconductive layer, there may partly exist linear structural bodies that do not contribute to formation of the network structure (i.e., that has no contact points, and exists independently of the other linear structural bodies or of the network structure). The network structure can be observed by a method described later.

Since the electroconductive component that constitutes the electroconductive layer of the electroconductive stack body of the present invention is preferably made up of a linear structural body that has a network structure, the cases where the content proportion of the linear structural bodies having a network structure in the electroconductive layer is less than or equal to a certain value include a case where regions in which no linear structural bodies exist are scattered within a plane. However, even if such a region exists, electroconductivity can be exhibited between arbitrary two points.

Furthermore, as for the linear structural body that constitutes the network structure, the length in short axis (the diameter of the linear structural body) and the length in long axis (the length of the linear structural body) can be in various ranges. However, the length thereof in short axis is preferred to be 1 nm to 1000 nm (1 μm), and it suffices that the length thereof in long axis, relative to the length in short axis, is such a length that the aspect ratio (the length in long axis/the length in short axis) is greater than 10, and the length thereof in long axis is preferred to be 1 μm to 100 μm (0.1 mm). As the linear structural body, there can be cited, for example, fibrous electroconductors, acicular electroconductors, such as nanowire, whisker or nanorod, etc. Incidentally, fibrous refers to a shape of which the aforementioned aspect ratio=(the length in long axis)/(the length in short axis) is greater than 10, and which has a linear portion and/or a bent portion as shown as examples by reference characters 6 and 7 in FIG. 2. The nanowire is a linear structural body having the shape of an arc as shown as an example by reference character 8 in FIG. 2, and acicular refers to a linear structural body having a linear shape as shown as an example by reference character 9 in FIG. 2. Incidentally, the linear structural body, besides existing singularly in some cases, exists as an aggregate in some other cases. The aggregated state in the case where the linear structural body exists as an aggregate may be, for example, a state in which the directions of arrangement of linear structural bodies have no regularity but are randomly aggregated, or may also be a state in which linear structural bodies are aggregated with surfaces of linear structural bodies in the long axis direction being parallel with each other. As an example of the state in which aggregation occurs so that surfaces in the long-axis direction are parallel, it is known that linear structural bodies form an aggregate termed bundle. It is also permissible that a linear structural body has a similar bundle structure. As for the average diameter r of linear structural bodies in the present invention, the diameter of a single linear structural body is defined as a diameter r even in the case where linear structural bodies exist as an aggregate as mentioned above. Incidentally, the diameter r of a linear structural body is found by the following method.

Firstly, a vicinity around a portion of a sample that is desired to observed is embedded, frozen and fixed in ice, a rotary-type microtome made by Nihon Microtome Laboratory (K.K.) was used to cut a stack body in a direction perpendicular to the plane of the stack body, with a diamond knife set at a knife inclination angle of 3°. Then, an electroconductive region (A) in a cross-section of the stack body obtained is observed under an electric field radiation type scanning electron microscope (JSM-6700-F made by JEOL (K.K.)), at an acceleration voltage of 3.0 kV, at an observation magnification of 10000 to 100000 times, while the image contrast is appropriately adjusted. For each specimen, images each including cross sections of the linear structural body obtained from different portions thereof are prepared for 10 visual fields. Next, the diameters of the cross sections of the linear structural body in all the 10 visual fields were found, and the average value of all the diameters is defined as an average diameter r. Incidentally, for this measurement, a magnification that secures three significant digits is selected. For the calculation, the fourth digit is used as a reference to find a rounded-off value.

The material of linear structural bodies in the present invention contains components such as metal, alloy, metal oxide, metal nitride, metal hydroxide, etc. As the metal, there can be cited metal elements belonging to the Groups 2 to 15 in the periodic table of elements. Concretely, there can be cited gold, platinum, silver, nickel, copper, aluminum, gallium, zirconium, hafnium, vanadium, niobium, tantalum, chrome, molybdenum, manganese, antimony, palladium, bismuth, technetium, rhenium, iron, osmium, cobalt, zinc, scandium, boron, gallium, indium, silicon, germanium, tellurium, tin, magnesium, etc. As the alloy, there can be cited alloys that contain a metal mentioned above (stainless steel, brass, etc.). As the metal oxide, there can be cited $InO_2$, $SnO_2$, ZnO, etc. Furthermore, metal oxide complexes of these metal oxides ($InO_2Sn$, $SnO_2$—$Sb_2O_4$, —$SnO_2$—$V_2O_5$, $TiO_2(Sn/Sb)O_2$, $SiO_2(Sn/Sb)O_2$, $K_2O$-$nTiO_2$—$(Sn/Sb)O_2$, $K_2O$-$nTiO_2$—C, etc.) can also be cited. Furthermore, these metal oxides may be subjected to a surface treatment. Furthermore, what are obtained by coating or vapor-depositing a metal or a metal oxide mentioned above on a surface of an organic compound (e.g., vegetable fiber, synthetic fiber, etc.) or a non-metal material (e.g., inorganic fiber, etc.) are also included in the linear structural bodies. Of these linear structural bodies, sliver nanowires can be particularly preferably used from the viewpoint of optical properties, such as transparency and the like, electroconductivity, etc. These metal-based nanowires can be obtained by, for example, production process disclosed in Published Japanese Translation of PCT Application No. 2009-505358, Japanese Patent Application Publication No. 2009-146747, and Japanese Patent Application Publication No. 2009-70660.

Furthermore, linear structural bodies can be used alone or in combination of more than one as a mixture. Furthermore, a micro to nano-sized electroconductive material of another kind may be used according to need.

[Electroconductive Layer]

The electroconductive layer of the present invention contains as an essential component a linear structural body that has a network structure mentioned above, and may contain, as other components, a compound having in its molecule a structure of the structural expression (1) described later or a high-molecular matrix or, furthermore, an additive, such as a binder, a dispersion agency or a leveling agent, that is contained in a water-containing dispersion liquid of a linear structural body described later.

The average value A of the opening areas found regarding opening portions that satisfy Expression (1), of the opening areas of opening portions that are formed by the network structure of linear structural bodies, is less than or equal to 20 $\mu m^2$, and the variation deviation σ of the opening areas defined by Expression (2) is less than or equal to 26 $\mu m^2$. (Hereinafter, the average value A of the opening areas found regarding opening portions that satisfy Expression (1), of the opening areas of the opening portions that are formed by the network structure of linear structural bodies, may sometimes be simply termed the average value A, and the variation deviation σ of the opening areas defined by Expression (2) may sometimes be simply termed the variation deviation σ)

$$X < X\mathrm{max} \times 0.9 \quad \text{Expression (1)}$$

(in the expression, X represents each opening area, and Xmax represents the maximum value of each opening area.)

$$\sigma = \{\Sigma(X-A)^2/N\}^{0.5} \text{ (where as for } \Sigma, i=1 \text{ to } N) \quad \text{Expression (2)}$$

(in the expression, X represents each of the opening areas of the opening portions that satisfy Expression (1), A represents the average value of the opening areas X of the opening portions that satisfy Expression (1), and N represents the total number of the opening portions that satisfy Expression (1).)

Figure 3:
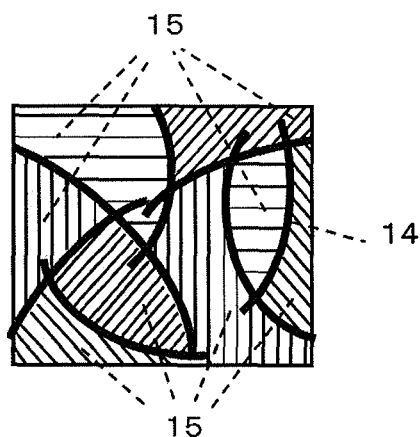
FIG. 3 is a schematic diagram showing an example of an opening portion formed by a network structure of a linear structural body in the present invention.

It is estimated that because the average value A is less than or equal to 20 $\mu m^2$, the linear structural bodies become packed, and furthermore, because the variation deviation σ of the opening areas is less than or equal to 26 $\mu m^2$, the network structure of the linear structural bodies becomes uniform and the electroconductive paths in a plane increase in number, so that the surface resistance value lowers and the electroconductivity becomes good. Incidentally, the opening portions in the present invention are closed regions as shown by reference numeral 15 in FIG. 3 that are divided by linear structural bodies denoted by reference numeral 14, and the average A and the variation deviation σ are defined as values found by a method employing image processing described in "(3) AVERAGE VALUE A AND VARIATION DEVIATION σ" in conjunction with the examples described below. In FIG. 3, in the regions divided by linear structural bodies, there exist regions enclosed only by linear structural bodies and regions enclosed by linear structural bodies and an outline of a visual field. Expression (1) mentioned above has a meaning that because impairment occurs in the reproducibility of data calculated in the case where union of regions occur in a portion where a boundary line is low in density at the time of binarization of image processing in "(3) AVERAGE VALUE A AND VARIATION DEVIATION σ" in conjunction with working examples described below, such regions are to be removed from the object regions for calculation. The regions enclosed by linear structural bodies and the outline of a visual field are subject to the foregoing union of regions in the image processing. A coefficient of 0.9 in Expression (1) mentioned above is set so that union of regions in such a case can be removed. Concretely, the average value A and the variation deviation σ are calculated a plurality times for each while the aforementioned coefficient is changed in a numerical range of 1 to 0.7, and the average value A and the variation deviation σ are set by adopting maximum values with which there is no influence of the union of regions (maximum values are taken because excessively small values thereof increase the possibility of discarding a normal region from the object regions). Specifically, if this coefficient is close to 1, the average value A and the variation deviation σ are affected by the regions whose union has occurred, and therefore the reproducibility of these values is impaired; however, as the coefficient is made smaller, the reproducibility of these values improves. With the reproducibility of these values as a reference, a coefficient of 0.9 has been adopted. As for the opening area of the opening portion, it is preferable that the average value A be less than or equal to 10 μm² and the variation deviation σ be less than or equal to 17 μm², and it is more preferable that the average value A be less than or equal to 5 μm² and the variation deviation σ be less than or equal to 9 μm², and it is even more preferable that the average value A be less than or equal to 3 μm² and the variation deviation σ be less than or equal to 4 μm².

The electroconductive layer of the present invention is preferred to further contain, besides the linear structural body, a compound that has in its molecule a structure of the following structural expression (1):

[CHEM. 2]

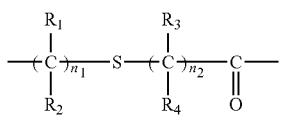

(1)

(in the expression Ra (a=1 to 4) represents H or F. n1 and n2 each independently represent an integer of 1 to 10.)

If a compound that has in its molecule the structure of the structural expression (1) is contained, the surface resistance value will become lower and the electroconductivity of the electroconductive stack body can be further improved. The content of the compound that has in its molecule the structure of the structural expression (1) is dependent on the kind and stacked amount of the linear structural body and, furthermore, the structure of the compound that has in its molecule the structure of the structural expression (1), and therefore cannot be unambiguously limited. However, the content thereof is preferred to be 30 to 100 mass parts relative to 100 mass parts of the linear structural body in the electroconductive layer. If the content thereof is less than 30 mass parts, there occur cases where no effect can be obtained. If the content thereof is greater than 100 mass parts, there occur cases where homogeneity is impaired in the network structure of the linear structural body.

With regard to the compound that has in its molecule the structure of the structural expression (1), there can be cited, for example, Capstone FS-65 of the Capstone series and Zonyl FSA of the Zonyl series made by U.S. DuPont company, etc. as concrete commercially available compounds.

The electroconductive layer of the present invention is preferred to further contain a high-molecular matrix as well as the linear structural body. The electroconductive stack body, in some cases, is exposed to high temperature or high humidity when processed for an electrode that is to be used for touch panels, etc. By providing a high-molecular matrix in the electroconductive layer, the network structure of the linear structural body can be protected, a low surface resistance value can be kept even in a severe environment of high temperature, high humidity, etc., and an electroconductivity can be maintained.

[High Molecular Matrix]

As a component of the high-molecular matrix, there can be cited organic or inorganic high-molecular compounds, etc.

As the inorganic-based high molecular compound, there can be cited inorganic base oxides, etc. For example, it is possible to use sol/gel coating films formed by hydrolysis/polymerization reactions, with alcohol, water, acid, etc., of organoalkoxysilane, that is, silicon oxides, such as: tetraalkoxysilanes, such as tetramethoxysilane, tetraethoxysilane, tetra-n-propoxysilane, tetra-i-propoxysilane, tetra-n-butoxysilane, etc.; trialkoxysilanes, such as methyl trimethoxysilane, methyl triethoxysilane, ethyl trimethoxysilane, ethyl triethoxysilane, n-propyl trimethoxysilane, n-propyl triethoxysilane, i-propyl trimethoxysilane, i-propyl triethoxysilane, n-butyl trimethoxysilane, n-butyl triethoxysilane, n-pentyl trimethoxysilane, n-pentyl triethoxysilane, n-hexyl trimethoxysilane, n-heptyl trimethoxysilane, n-octyl trimethoxysilane, vinyl trimethoxysilane, vinyl triethoxysilane, cyclohexyl trimethoxysilane, cyclohexyl triethoxysilane, phenyl trimethoxysilane, phenyl triethoxysilane, 3-chloropropyl trimethoxysilane, 3-chloropropyl triethoxysilane, 3,3,3-trifluoropropyl trimethoxysilane, 3,3,3-trifluoropropyl triethoxysilane, 2-hydroxy ethyl trimethoxysilane, 2-hydroxy ethyl triethoxysilane, 2-hydroxy propyl trimethoxysilane, 2-hydroxy propyl triethoxysilane, 3-hydroxy propyl trimethoxysilane, 3-hydroxy propyl triethoxysilane, 3-glycidoxypropyl trimethoxysilane, 3-glycidoxypropyl triethoxysilane, 2-(3,4-epoxy cyclohexyl)ethyl trimethoxysilane, 2-(3,4-epoxy cyclohexyl)ethyl triethoxysilane, 3-(meth)acryl-oxy propyl trimethoxysilane, 3-(meth)acryl-oxy propyl triethoxysilane, vinyl trimethoxysilane, vinyl triethoxysilane, allyl trimethoxysilane, vinyl triacetoxysilane, etc.; methyl triacetyloxysilane; methyl triphenoxysilane; etc., as well as sputtered vapor-deposited films of silicon oxides, etc.

As the organic-based high molecular compound, there can be cited thermoplastic resin, thermosetting resin, photosetting resin, etc. For example, there can be cited organic base high molecular compounds such as: polyester-based resins; polycarbonate resins; acryl-based resins; methacryl-based resins; epoxy-based resins; polyamide-based resins, such as nylon, benzoguanamine, etc.; ABS resins; polyimide-based resin; olefin-based resin, such as polyethylene, polypropylene, etc.; polystyrene resins; polyvinyl acetate resins; melamine-based resins; phenol-based resins; resins containing chlorine (Cl), such as polyvinyl chloride, polyvinyliden chloride, etc.; resins containing fluorine (F); silicone-based resins; cellulose-based resins, etc. Of these compounds, at least one species may be selected, or two or more species may be mixed, with required characteristics, productivity, etc., taken into account. Preferably, the organic-based high molecular compound is preferred to be constructed by a high molecule that contains a structure obtained through polymerization reaction of a compound that has two or more carbon-carbon double bond groups that contribute to the polymerization reaction. Such high molecules can be obtained by forming carbon-carbon single bonds through the polymerization reaction of a composition made of a monomer, an oligomer or a polymer that has two or more carbon-carbon double bond groups that contribute to the polymerization reaction, with carbon-carbon double bonds in the carbon-carbon double bond groups serving as reaction points.

As the functional groups that contain carbon-carbon double bond groups, there can be cited, for example: isopropenyl groups, isopentenyl groups; allyl groups; acryloyl groups; methacryloyl groups; acryloyl oxy groups; methacryloyl oxy groups; methacryl groups; acrylamide groups; meth-acrylamide groups; allylidene groups; allylidyne groups; vinyl ether groups; groups in which a halogen element, such as fluorine, chlorine, etc., is bound to a carbon of a carbon-carbon double bond group (e.g., a vinyl fluoride group, a vinylidene fluoride group, a vinyl chloride group, a vinylidene chloride group, etc.); groups in which a substituent group having an aromatic ring, such as a phenyl group, a naphthyl group, etc., is bound to a carbon of a carbon-carbon double bond group (e.g., a styryl group, etc.); groups having a conjugated polyene structure, such as a butadienyl group (e.g., $CH_2=C(R_1)-C(R_2)=CH$, $CH_2=C(R_1)-C(=CH_2)-$ ($R_1$ and $R_2$ are H or $CH_3$)); etc. It suffices that, of these functional groups, one species or two or more species are used in mixture, with required characteristics, productivity, etc., taken into consideration.

As the compound having two or more carbon-carbon double bond groups that contribute to polymerization reaction, there can be cited, for example: pentaerythritol triacrylate, pentaerythritol trimethacrylate, pentaerythritol tetraacrylate, pentaerythritol tetramethacrylate, pentaerythritol ethoxy triacrylate, pentaerythritol ethoxy trimethacrylate, pentaerythritol ethoxy tetraacrylate, pentaerythritol ethoxy tetramethacrylate, dipentaerythritol triacrylate, dipentaerythritol trimethacrylate, dipentaerythritol tetraacrylate, dipentaerythritol tetramethacrylate, dipentaerythritol pentaacrylate, dipentaerythritol pentamethacrylate, dipentaerythritol hexaacrylate, dipentaerythritol hexamethacrylate, trimethylol propane triacrylate, trimethylol propane trimethacrylate, trimethylol propane ethoxy triacrylate, trimethylol propane ethoxy trimethacrylate, ditrimethylol propane triacrylate, ditrimethylol propane trimethacrylate, ditrimethylol propane tetraacrylate, ditrimethylol propane tetramethacrylate, glycerin propoxy triacrylate, glycerin propoxy trimethacrylate; compounds having in their melecules a cyclic skeleton, such as a cyclopropane ring, a cyclobutane ring, a cyclopentane ring, a cyclohexane ring, etc. (e.g., triacrylate, trimethacrylate, tetraacrylate, tetramethacrylate, pentaacrylate, pentamethacrylate, hexaacrylate, hexamethacrylate, etc.); compounds obtained by partially modifying aforementioned compounds (e.g.: 2-hydroxy propane acid-modified pentaerythritol triacrylate, 2-hydroxy propane acid-modified pentaerythritol trimethacrylate, 2-hydroxy propane acid-modified pentaerythritol tetraacrylate, 2-hydroxy propane acid-modified pentaerythritol tetramethacrylate modified with 2-hydroxy propane acid; silicone triacrylate, silicone trimethacrylate, silicone tetraacrylate, silicone tetramethacrylate, silicone pentaacrylate, silicone pentamethacrylate, silicone hexaacrylatek, silicone hexamethacrylate into which a silicone skeleton has been introduced; etc.); compounds having in their skeletons a vinyl group and/or a vinylidene group and further having another skeleton (e.g.: urethane triacrylate, urethane trimethacrylate, urethane tetraacrylate, urethane tetramethacrylate, urethane pentaacrylate, urethane pentamethacrylate, urethane hexaacrylate and urethane hexamethacrylate that have a urethane skeleton; polyether triacrylate, polyether trimethacrylate, polyether tetraacrylate, polyether tetramethacrylate, polyether pentaacrylate, polyether pentamethacrylate, polyether hexaacrylate and polyether hexamethacrylate that have an ether skeleton; epoxy triacrylate, epoxy trimethacrylate, epoxy tetraacrylate, epoxy tetramethacrylate, epoxy pentaacrylate, epoxy pentamethacrylate, epoxy hexaacrylate and epoxy hexamethacrylate that have an epoxy-derived skeleton; polyester triacrylate, polyester trimethacrylate, polyester tetraacrylate, polyester tetramethacrylate, polyester pentaacrylate, polyester pentamethacrylate, polyester hexaacrylate and polyester hexamethacrylate that have an ester skeleton; etc.).

With use, required characteristics, productivity, etc. taken into consideration, it is possible to use a composition that contains, of the foregoing compounds, a polymerized product of a single species of compound or two or more kinds of polymerized products each of which is a product of a single species of compound and/or a composition that contains an oligomer that is higher in class than or equal in class to a dimer and that two or more species of compounds and that is provided by copolymerization of two or more species of compounds; however, these compositions or the like do not impose any particular restriction. Of these compounds, compounds having four or more carbon-carbon double bond groups that contribute to the polymerization reaction, that is, compounds having four or more functions, can be more preferably used. As the compounds having four or more functions, there can be cited, for example, four-function tetraacrylate, tetramethacrylate, five-function pentaacrylate, pentamethacrylate, hexaacrylate and hexamethacrylate that have six functions, which have been mentioned above. Furthermore, the compounds may also be compounds having seven or more functions.

As for these compounds, there can be cited as concrete commercially available compounds, for example: the LIGHT ACRYLATE series, the LIGHT ESTER series, the EPDXY ESTER series, the URETHANE ACRYLATE AH series, the URETHANE ACRYLATE AT series and the URETHANE ACRYLATE UA series made by Kyoeisha Chemical (K.K.); the "EBECRYL" (registered trademark) series (e.g., EBECRYL 1360) PETIA, TMPTA, TMPEOTA, OTA 480, DPHA and PETA-K made by DAICEL-CYTEC (K.K.); the "Fullcure" (registered trademark) series made by Soken Chemical & Engineering (K.K.); the "LIODURAS (riodyurasu))" (registered trademark) series made by TOYO INK (K.K.); the "PHOLUCID" (registered trademark) series made by CHUGOKU MARINE PAINTS (K.K.); the EXP series made by MATSUI CHEMICAL (K.K.); the X-12-2456 series made by Shin-Etsu Chemical (K.K.); etc.

[Substrate]

As a material of the substrate in the electroconductive stack body of the present invention, there can be concretely cited, for example, a transparent resin, glass, etc. As the resin, there can be cited polyesters, such as polyethylene terephthalate (PET), polyethylene naphthalate (PEN), etc., polyamide, polyimide, polyphenylene sulfide, aramid, polyethylene, polypropylene, polystyrene, polylactic acid, polyvinyl chloride, polycarbonate, acryl-based or methacryl-based resins, such as polymethacrylic acid methyl or the like, alicyclic acrylic resin, cycloolefin resin, triacetyl cellulose, ABS, polyvinyl acetate, melamine-based resin, phenol-based resin, resins that contain chlorine (Cl), such as polyvinyl chloride, polyvinylidene chloride, etc., resins that contain fluorine (F), silicone-based resins, and resins obtained by mixing and/or copolymerizing these resins. As the glass, an ordinary soda-lime glass can be used. Furthermore, a plurality of these substrates can be used in combination as well. For example, the substrate may be a composite substrate, such as a substrate combining a resin and a glass, a substrate in which two or more kinds of resins are stacked, etc. With regard to the shape of the substrate, the substrate may be a film of 250 µm or less in thickness that can be rolled up, or a substrate that exceeds 250 µm in thickness. From the viewpoint of cost, productivity, handing characteristic, etc., the substrate is preferred to be a resin film of 250 µm or less, and more preferably 190 µm or less, and even more preferably 150 µm or less, and is particularly preferably a resin film of 100 µm or less. In the case where a resin film is used as the substrate, a film formed without stretching a resin or through monoaxial stretching or biaxial stretching. Of these resin films, polyester films, such as polyethylene terephthalate (PET), polyethylene naphthalate (PEN), etc., PET films obtained through mixture and/or copolymerization with PEN, and polypropylene films can be preferably used, from the viewpoints of the formability to the substrate, optical properties such as transparency or the like, productivity, etc.

In the present invention, the substrate is preferred to be a hydrophilic substrate in which a hydrophilic layer containing a compound that has a hydrophilic group is stacked on an outermost layer on at least one side surface of a substrate as mentioned above. If the substrate is the hydrophilic substrate, the average value A and the variation deviation $\sigma$ of the opening areas of opening portions formed by the network structure of the linear structural body particularly can be brought into preferred ranges, particularly in the case where an electroconductive layer is formed by applying the water-containing dispersion liquid to the linear structural body and then drying the water-containing dispersion liquid. Thus, an electroconductive stack body that is low in the surface resistance value and good in electroconductivity can be more easily obtained. As examples of the compound having a hydrophilic group, there can be cited compounds having a hydrophilic group in the structure of a resin for use for a substrate or a compound of a high-molecular matrix mentioned above; however, the compound is not particularly limited. Furthermore, as the hydrophilic group, there can be cited, for example, a hydroxyl group, a carboxylic acid group, a phosphoric acid group, an amino group, a quaternary ammonium base group, a sulfonic acid group, or states in which a part of such a hydrophilic group has a counter cation, such as $Na^+$, $K^+$, etc. (e.g., —ONa, —COONa, —SO$_3$Na, etc.), and one species of these groups or a mixture of two or more kinds thereof is permissible. Of these functional groups, the carboxylic acid group and the sulfonic acid group that are likely to provide hydrophilicity or states in which a part of one of the hydrophilic groups has a counter cation, such as Na+, $K^+$, etc. (—COONa, —SO$_3$Na) can be preferably used.

[Production Method for Electroconductive Stack Body]

The method of producing the electroconductive stack body of the present invention is not particularly limited. The electroconductive layer may be formed by stacking on the substrate only an electroconductive material (linear structural body) or a mixture of an electroconductive material (linear structural body) and the aforementioned high-molecular matrix, or the electroconductive layer may also be stacked by firstly forming only an electroconductive material (linear structural body) on the substrate beforehand and then forming a high-molecular matrix. Thus, the method is not particularly limited.

[Formation Method for Electroconductive Layer]

As for the method of forming the electroconductive layer on the substrate in the present invention, it suffices that an optimum method is selected according to the kinds of the linear structural body or the matrix, and there can be cited common methods such as casting, spin coating, dip coating, bar coating, spraying, blade coating, slit die coating, gravure coating, reverse coating, screen printing, mold application, print transcription, wet coating methods including inkjet and the like, etc. Among these, the slit die coating that is capable of uniformly stacking an electroconductive layer and is unlikely to allow flow to be formed in the substrate, or the wet coating method that uses micro-gravure capable of uniformly forming an electroconductive layer with good productivity. Incidentally, as for forming the electroconductive layer on the substrate, the electroconductive layer may be formed by arranging on the substrate beforehand an electroconductive component that has a network structure that is made by an electroconductive material (linear structural body), and then arranging the matrix, and combining it with the electroconductive material (linear structural body) to provide a composite. Alternatively, an electroconductive layer that contains an electroconductive component that has a network structure may be formed by mixing an electroconductive material (linear structural body) and a matrix beforehand to form an electroconductive matrix composition and stacking the electroconductive matrix composition on the substrate. Incidentally, the electroconductive material (linear structural body) may be a material made of a single raw material, or may also be a mixture of a plurality of raw materials. Likewise, the matrix may be a material made of a single raw material, or may also be a mixture of a plurality of raw materials.

In the present invention, what is particularly preferred is a production method for the electroconductive stack body, wherein, in a step of forming an electroconductive layer by applying a water-containing dispersion liquid of a linear structural body onto a substrate and then drying the water-containing dispersion liquid by an appropriately selected method mentioned above, the drying step is a step of causing an air stream whose temperature is 25 to 120° C. to strike a surface on which the water-containing dispersion liquid has been applied, from a direction of 45 to 135° relative to the direction of application.

By adopting this method, the average value A and the variation deviation $\sigma$ of the opening areas of opening portions formed by the network structure of the linear structural body can be brought into preferred ranges, so that an electroconductive stack body that is low in the surface resistance value and good in electroconductivity can be more easily obtained. Incidentally, the water-containing dispersion liquid of the linear structural body may contain an additive agent, such as a binder, a dispersion agent, a leveling agent, etc., besides the linear structural body and water, which is a solvent. Description will be given with respect to causing an air stream to strike a surface on which the water-containing dispersion liquid has been applied, from a direction of 45 to 135° relative to the direction of application. By causing, after applying the liquid to the substrate of the linear structural body to the substrate, an air stream to strike the surface on which the water-containing dispersion liquid has been applied, from a direction of 45 to 135° relative to the direction of application, the network structure is likely to be uniform, and the variation deviation $\sigma$ regarding the opening portions can be made small. The air stream direction is preferably 60 to 120°, and more preferably 85 to 95° relative to the direction of application. Conversely, if the air stream direction is less than 45° or greater than 135° relative to the direction of application, there are cases where no effect can be obtained. Next, description will be given with respect to the temperature of the air stream being 25 to 120° C. at that time. In the case where the temperature of the air stream in the desiccation step is 25 to 120° C., the linear structural body does not undergo aggregation or the like, and can be uniformly dispersed with the electroconductive layer surface, so that it becomes easier to adjust the average value A and the variation deviation $\sigma$ of the opening areas into desired regions. The temperature of the air stream is preferably 30 to 100° C., and more preferably 50 to 90° C. In the case where the temperature is less than 25° C., there are cases where the drying of the water-containing dispersion liquid of the linear structural body becomes slow, and there are cases where the variation deviation $\sigma$ regarding the opening portions becomes great. On the other hand, if the temperature is higher than 120° C., the water-based solvent is likely to rapidly evaporate, and is likely to be dried nonuniformly within the surface of the electroconductive layer, and therefore there are cases where the average value A and the variation deviation σ of the opening areas become large. The means of temperature adjustment can be selected according to purpose and use. There can be cited, for example, a hot plate, a hot air oven, an infrared ray oven, irradiation with microwaves of 300 megahertz to 3 terahertz in frequency, etc. However, the means of temperature adjustment is not limited to the aforementioned means. Incidentally, the temperature of the air stream refers to the temperature at a position that is 10 mm above the surface on which the liquid has been applied.

In the method of forming the matrix of the electroconductive layer of the electroconductive stack body of the present invention, the matrix is formed by reacting the composition containing a component of the high-molecular matrix mentioned above. The formation of the high-molecular matrix caused by the reaction in this case is termed setting. As the method of setting the composition that contains a component of the high-molecular matrix, there can be cited setting by heating, and photosetting by irradiation with active electron beam such as ultraviolet light, visible light, electron beam, etc. (hereinafter, termed photosetting). In the case of setting by heating, it takes a time to heat the entire system to the setting start temperature. On the other hand, in the case of photosetting, activated species can be produced simultaneously in the entire system by irradiating with active electron beam the system in which an initiation agent for photosetting (hereinafter, termed photoinitiator) as mentioned below has been contained, so that the time required for initiation of setting can be shortened, so that the setting time can also be shortened. For this reason, photosetting is more preferable. Herein, the photoinitiator is a substance which absorbs active electron beam, such as light in the ultraviolet region, light in the visible region, electron beam, etc., so as to produce an active species, such as a radial species, a cation species, an anion species, etc., that is an active species that initiate a reaction, and which therefore initiates a chemical reaction. As the photoinitiators that can be used, there can be cited, for example: benzophenone series such as benzophenone, hydroxy benzophenone, 4-phenyl benzophenone, etc.; benzoin series such as benzyl dimethylketal, etc.; α-hydroxyketone series or α-aminoketone series such as 1-hydroxycyclohexyl-phenyl-ketone, 2-hydroxy-2-methyl-1-phenyl-propane-1-one, 2-methyl 1[4-(methylthio)phenyl]-2-morpholinopropane-1-one, 2-benzyl-2-dimethylamino-1-(4-morpholinophenyl)-butanone-1, etc.; thioxanthone series such as isopropyl thioxanthone, 2-4-diethylthioxanthone, etc.; methylphenyl glyoxylate; etc. From the viewpoint of the value of the maximum absorption wavelength, absorbance, color trial, degree of coloring, etc., one, or two or more species of these photoinitiators can be used in combination.

As commercialized products of the photoinitiators mentioned above, there can be cited Ciba "IRGACURE (registered trademark)" 184 (made by Ciba Japan (K. K.)) as 1-hydroxy-cyclohexyl-phenyl-ketone, Ciba "IRGACURE" (registered trademark) 907 (made by Ciba Japan (K. K.)) as 2-methyl 1[4-(methylthio)phenyl]-2-morpholinopropane-1-one, Ciba "IRGACURE" (registered trademark) 369 (made by Ciba Japan (K. K.)) as 2-benzyl-2-dimethylamino-1-(4-morpholinophenyl)-butanone-1, etc.

By appropriately selecting the kind of the active electron beam according to the kind and property of the matrix, or having only one species of the aforementioned photoinitiators alone contained or two or more species different in the absorption wavelength region contained on the basis of the kind of the active electron beam selected, or adjusting the amount of irradiation with the active electron beam, or appropriately combining these measures, it is possible to obtain the electroconductive stack body of the present invention. In particular, the method in which the amount of irradiation with the active electron beam is adjusted is relatively easy to carry out, and is therefore preferably employed. As for the method in which the amount irradiation is adjusted, control can be relatively easily carried out by changing the condition (output condition) of the beam radiating body, such as a lamp or the like, that radiates the active electron beam. Besides, the accumulated irradiation amount can be controlled by changing the radiation distance between the beam radiating body, such as a lamp or the like, and an irradiated body, or by shortening the irradiation time by adjusting the conveyance speed of an irradiated body in the production of the electroconductive stack body of the present invention. The accumulated amount of irradiation with the active electron beam is preferred to be less than or equal to 300 $mJ/cm^2$, and more preferably less than or equal to 150 $mJ/cm^2$, and even more preferably less than or equal to 100 $mJ/cm^2$. The lower limit value of the accumulated amount of irradiation with the active electron beam is not particularly limited; however, since if it is less than 1 $mJ/cm^2$ there are cases where a defective, such as insufficient setting of the matrix, or the like, occurs, the lower limit value is preferred to be greater than or equal to 1 $mJ/cm^2$. Furthermore, as for irradiation with the active electron beam, a method in which irradiation is performed in a specific atmosphere in which the oxygen concentration is made low, such as an atmosphere in which replacement with an inert gas such as nitrogen, argon, etc., has been carried out, an atmosphere in which oxygen degassing has been carried out, etc., is effective. It is preferable that the accumulated amount of irradiation with the active electron beam be realized in a specific atmosphere in which the oxygen concentration has been made low.

The electroconductive stack body in accordance with the present invention is preferred to be a transparent electroconductive stack body whose total light transmittance based on JIS K7361-1:1997 with light being incident from the electroconductive layer side is greater than or equal to 80%. The touch panel incorporating the electroconductive stack body of the present invention exhibits excellent transparency, and what is displayed by a display provided on a layer below the touch panel in which the transparent electroconductive stack body is used can be vividly recognized. The transparency in the present invention means that the total light transmittance based on JIS K7361-1:1997 with light being incident from the electroconductive layer side is greater than or equal to 80%, and preferably greater than or equal to 85%, and more preferably greater than or equal to 90%. As a method for increasing the total light transmittance, there can be cited, for example, a method in which the total light transmittance of the substrate used is increased, a method in which the membrane thickness of the electroconductive layer is made less, a method in which the electroconductive layer is stacked so as to be an optical interference film, etc.

As the method in which the total light transmittance of the substrate is increased, there can be cited a method in which the thickness of the substrate is made small or a method in which a substrate of a material whose total light transmittance is large is chosen. As for the substrate of the transparent electroconductive stack body of the present invention, a substrate whose total light transmittance for visible ray is high can be preferably used; concretely, a substrate whose total light transmittance based on JIS K7361-1:1997 is greater than or equal to 80%, and more preferably a substrate having a transparency of greater than or equal to 90%. Of the substrate mentioned in the foregoing paragraph [SUBSTRATE], corresponding substrates can be used as appropriate.

Furthermore, in the present invention, an opposite surface of the substrate to the electroconductive side (in the present invention, it is permissible that the side where the electroconductive layer is stacked) has been subjected to a hard coat treatment so as to be given an abrasion resistance, a high surface hardness, a solvent resistance, a stain resistance, etc.

Next, explanation of the method in which the electroconductive layer is stacked so as to be an optical interference film will be presented below.

The electroconductive material (linear structural body) reflects or absorbs light due to the physical property of its own electroconductive component. Therefore, in order to increase the total light transmittance of the transparent electroconductive stack body that includes the electroconductive layer provided on the substrate, it is effective to form a matrix from a transparent material and provide the electroconductive layer so that the electroconductive layer becomes an optical interference film, and to lower the average reflectance of the optical interference film side at a wavelength of 380 to 780 nm to less than or equal to 4%. Preferably, to lower the average reflectance to less than or equal to 3% and, more preferably, to less than or equal to 2% is effective. If the average reflectance is less than or equal to 4%, the property of the total light transmittance being greater than or equal to 80% in the case where the transparent electroconductive stack body is used for use in tough panels or the like can be obtained with good productivity. Therefore, the average reflectance of less than or equal to 4% is preferable.

As for the electroconductive stack body of the present invention, the surface resistance value thereof at the electroconductive layer side is preferred to be greater than or equal to $1 \times 10^0 \Omega/\square$ and less than or equal to $1 \times 10^4 \Omega/\square$ and, more preferably, greater than or equal to $1 \times 10^1 \Omega/\square$ and $1.5 \times 10^3 \Omega/\square$. When the surface resistance value is in this range, the electroconductive stack body can be preferably used as an electroconductive stack layer for use in touch panels. That is, if the surface resistance value is greater than or equal to $1 \times 10^0 \Omega/\square$, the electric power consumption can be made less. If the surface resistance value is less than or equal to $1 \times 10^4 \Omega/\square$, the influence of the error in the coordinate reading regarding the touch panel can be made small.

To the substrate and/or the electroconductive layer for use in the present invention, various additives can be added within such ranges that the effect of the present invention is not impeded. As the additives, it is possible to use, for example, organic and/or inorganic fine particles, a crosslinking agent, a flame retardant, a flame retardant aid, a heat-resistant stabilizer, an oxidation-resistant stabilizer, a leveling agent, a slide activating agent, an antistatic agent, an ultraviolet absorber, a photostabilizer, a nucleating agent, a dye, a bulking agent, a dispersing agent, a coupling agent, etc.

Figure 2:
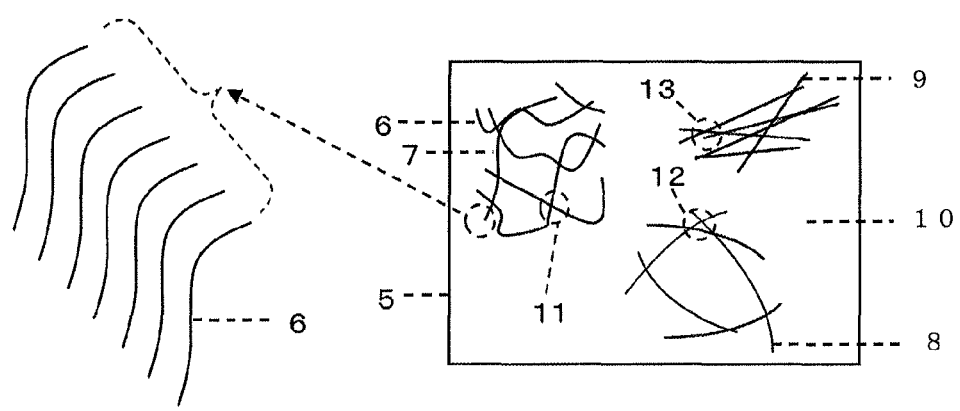
FIG. 2 is a schematic diagram showing an example of a linear structural body for use in the electroconductive stack body of the present invention.
Figure 4:
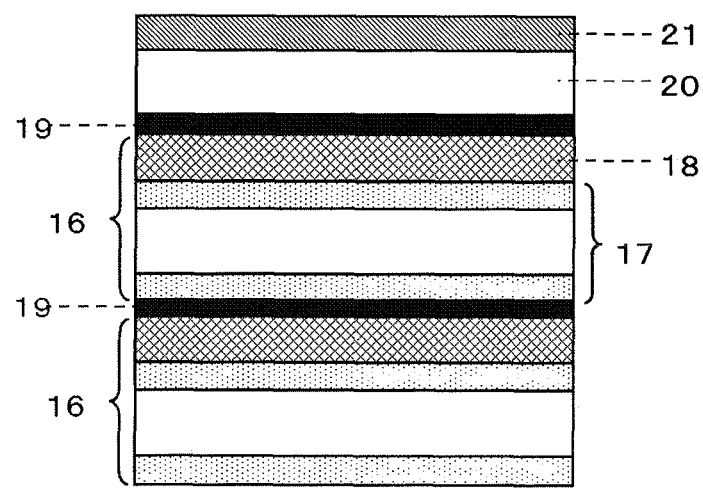
FIG. 4 is a sectional schematic diagram showing an example of a touch panel that is an aspect of the present invention.
Figure 5:
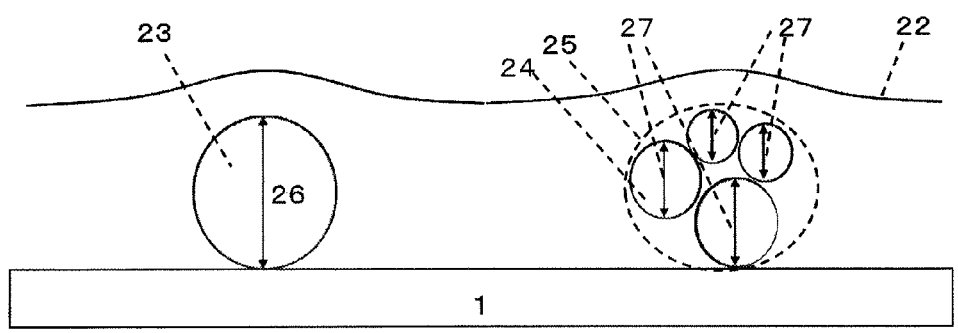
FIG. 5 is a sectional schematic diagram showing an example of a vicinity of the linear structural body of the present invention.

The electroconductive stack body of the present invention can be incorporated into a display body and, particularly, a touch panel and an electronic paper, so as to be preferably used. A schematic sectional view showing an example of a touch panel, among display bodies as mentioned above, is shown in FIG. 4. The touch panel of the present invention is a touch panel in which one electroconductive stack body (for example, FIG. 1) or a plurality of electroconductive stack bodies of the present invention in which an electroconductive layer having a network structure made by linear structural bodies is stacked, or in which one or more electroconductive stack bodies in combination with another member are incorporated. As examples of the touch panel of the present invention, there can be cited a resistance film-type touch panel, an electrostatic capacitance-type touch panel, etc. The electroconductive layer of the electroconductive stack body of the present invention contains linear structural bodies as denoted by reference characters 6, 7, 8 and 9 as shown in FIG. 2, and has a network structure that has contact points denoted by reference characters 11, 12 and 13. The touch panel formed by providing the electroconductive stack body of the present invention is one in which, as shown in FIG. 4, electroconductive stack bodies 16 can be stacked by joining them with a junction layer 19 of an adhesive, a gluing agent, etc. Furthermore, a substrate 20 at the side of the screen of the touch panel, and a hard coat layer 21 stacked on the touch panel screen-side of the substrate. Such a touch panel, for example, after lead wires, a drive unit, etc., are attached to the touch panel, is incorporated into a front face of a liquid crystal display, and then is used.

EXAMPLE

Hereinafter, embodiments of the present invention will be concretely described with reference to examples. However, the present invention is not limited by the following examples.

[Evaluation Method]

Firstly, evaluation methods for the examples and comparative examples will be described.

(1) Structure (Shape) of Electroconductive Component, and State of Network Structure of Electroconductive Component Using an insulation resistance meter (DG6, made by Sanwa Electric Instrument (K.K.)), the electroconductive face of a sample is specifically determined from the presence or absence of passage of electricity, while a probe is placed in contact with each face of the sample.

Next, a surface of each of an electroconductive region (A) and a non-electroconductive region (B) of the sample was observed at various magnifications, using a scanning transmission electron microscope ((K.K.) HITACHI SCANNING TRANSMISSION ELECTRON MICROSCOPE HD-2700 made by Hitachi High-Technologies or a field emission-type electron microscope (JSM-6700-F made by JEOL (K.K.)), at an acceleration voltage of 3.0 kV, while the observation magnification and the image contrast were appropriately adjusted.

In the case where observation by the foregoing method was difficult, then a color 3D laser microscope (VK-9700/9710 made by (K.K.) Keyence), an observation application (VK-H1V1 made by (K.K.) Keyence), a shape analysis application (VK-H1A1 made by (K.K.) Keyence) were used to observe a surface of the sample at the same position on the electroconductive side, at various magnifications, with accompanying standard objective lenses 10× (CF IC EPI Plan 10× made by (K.K.) NIKON), 20× (CF IC EPI Plan 20× made by (K.K.) NIKON), 50× (CF IC EPI Plan Apo 50× made by (K.K.) NIKON), and 150× (CF IC EPI Plan Apo 150× made by (K.K.) NIKON), and image analysis was performed from image data obtained by the observation.

(2) Identification of Electroconductive Component

Electroconductive layers were peeled from the samples, and were dissolved in a solvent into which the layers were to be dissolved. According to need, a common chromatography or the like represented by silica gel column chromatography, gel permeation chromatography, high-performance liquid chromatography, etc., is applied, so that each sample electroconductive layer was separated and purified into single substances, which were subjected to qualitative analyses mentioned below.

After that, the electroconductive components were appropriately concentrated and diluted so as to arrange the samples. Subsequently, components contained in the samples were specifically determined by using evaluation methods mentioned below.

As for the analytical techniques, the following techniques for analyses were combined for analyses, and techniques that allowed measurement in a combination of a smaller number of techniques were preferentially applied.

A nuclear magnetic resonance spectroscopic method ($^{1}$H-NMR, $^{13}$C-NMR, $^{29}$Si-NMR, $^{19}$F-NMR), a two-dimensional nuclear magnetic resonance spectroscopic method (2D-NMR), an infrared spectrophotometric method (IR), a Raman spectroscopic method, various mass spectroscopic methods (a gas chromatography mass spectroscopic method (GC-MS)), a pyrolysis gas chromatography mass spectroscopic method (pyrolysis GC-MS), matrix-assisted laser desorption/ionization mass spectroscopy (MALDI-MS), a time-of-flight mass spectroscopic method (TOF-MS), time-of-flight matrix-assisted laser desorption/ionization mass spectroscopy (MALDI-TOF-MS), a dynamic secondary ion mass spectroscopic method (Dynamic-SIMS), a time-of-flight secondary ion mass spectroscopic method (TOF-SIMS), other static secondary ion mass spectroscopic methods (Static-SIMS), etc.), an X-ray diffraction method (XRD), a neutron diffraction method (ND), a low-energy electron diffraction method (LEED), reflection high-energy electron diffraction method (RHEED), an atomic absorption spectrometric method (AAS), an ultraviolet photoelectron spectroscopic method (UPS), an Auger electron spectroscopic method (AES), an X-ray photoelectron spectroscopic method (XPS), a fluorescent X-ray elementary analysis method (XRF), an inductively-coupled-plasma emission spectrographic method (ICP-AES), an electron-beam microanalysis method (EPMA), a charged-particle excitation X-ray spectroscopic method (PIXE), a low-energy ion scattering spectroscopic method (RBS or LEIS), an intermediate-energy ion scattering spectroscopic method (MEIS), a high-energy ion scattering spectroscopic method (ISS or HEIS), gel permeation chromatography (GPC), transmission-electron-microscope-energy dispersion X-ray spectroscopic analysis (TEM-EDX), scanning electron microscope-energy dispersion X-ray spectroscopic analysis (SEM-EDX), gas chromatography (GC), other elemental analyses.

(3) Average Value A and Variation Deviation $\sigma$

As for the electroconductive layer side of each sample, the electroconductive side was subjected to surface observation at a magnification of 3000 times, using a color 3D laser microscope (VK-9700/9710 made by (K.K.) Keyence), an observation application (VK-H1V1 made by (K.K.) Keyence), and a shape analysis application (VK-H1A1 made by (K.K.) Keyence), with an accompanying standard objective lens 150× (CF IC EPI Plan Apo 150× made by (K.K.) NIKON), and a region of 70.656 μm×94.208 μm as an image of 768 pixels×1024 pixels, which was then subjected to image analysis. As for the image analysis, 5 samples were prepared for each level, and observation was performed in 10 fields of view for each sample, that is, a total of 50 fields of view for each level, and each 50 fields of view were subjected to image analysis by the following method to obtain data regarding the 50 fields of view, from which average values were calculated. (Incidentally, in the examples, evaluation was carried out with the magnification power and resolutions mentioned above; however, in the case where observation at the foregoing magnification is difficult as the length of the long axis and the length of the short axis (average diameter r) are different depending on the kind of the linear structural body, it suffices that a lower magnification is set by changing the objective lens to one of the accompanying standard objective lenses 10× (CF IC EPI Plan 10× made by (K.K.) NIKON), 20× (CF IC EPI Plan 20× made by (K.K.) NIKON), and 50× (CF IC EPI Plan Apo 50× made by (K.K.) NIKON), or a high magnification is set by changing the lens to an objective lens 200× (CF IC EPI Plan Apo 200× made by (K.K.) NIKON), and image data is taken at the same resolution, and then is subjected to image analysis in substantially the same manner. Furthermore, with regard to the resolution, it is suitable that the size of one pixel is equal to a region 0.1 μm long×0.1 μm wide of an evaluation object, but this is not restrictive.)

The image processing was performed concretely in the following environment and procedure.

OS: "Windows" (registered trademark) XP
CPU: "Celeron" (registered trademark) 3.4 GHz
Memory: 512 MB
Software application used: image processing library HALCON (Ver. 9.0 made by MVtec company)

Firstly, the image processing was carried out in the procedure of performing the reading of the image data, and subsequently performing contour enhancement (processed in order of a differential filter (emphasize) and an edge enhancement filter (shock_filter)), and then performing binarization. Incidentally, the "emphasize", that is, a differential filter, and the "shock_filter", that is, an edge enhancement filter, which are for use in the contour enhancement, are image processing filters that are included in HALCON, that is, the aforementioned image processing library. With regard to the binarization, an average value of luminances over an entire image was obtained, and the average value was multiplied by an offset of 10, and portions that exhibited values greater than that were determined as portions where a linear structural body existed. Furthermore, the gray value of each region where a linear structural body existed was substituted with 255, and the gray values of the other regions (opening portions) were substituted with 0, and then were subjected to expansion/shrinkage and making pitch more fine, followed by connecting contiguous pixels that had a gray value of 0 and extracting the pixels as an opening portion.

Next, the opening area X each of the opening portions within one field of vision which were extracted by the image processing was found. Then, with regard to each opening portion that satisfied Expression (1), of the opening portions in one field of vision, the variation deviation $\sigma$ of the opening area was calculated by Expression (2).

$$X < X\text{max} \times 0.9 \qquad \text{Expression (1)}$$

where Xmax was defined as a maximum value of the opening area in the image data obtained in one field of vision.

$$\sigma = \{\Sigma(X-A)^2/N\}^{0.5} \text{ (where as for } \Sigma, i=1 \text{ to } N) \qquad \text{Expression (2)}$$

wherein A was defined as an average value of the opening areas X of the opening portions that satisfied Expression (1), within one field of vision, and N was defined as a total number of the opening portions that satisfied Expression (1) within one field of vision.

(4) Surface Resistance Value $R_0$

The surface resistance value of the electroconductive layer side of the electroconductive stack body was measured in a central portion of each sample of 100 mm×50 mm by an eddy current method, by using a non-contact resistivity meter (NC-10 made by NAPSON (K.K.)). With respect to 5 samples, an average value was calculated, and the calculated value was determined as surface resistance value $R_0$ [Ω/□]. In the case where the detection limit was exceeded and therefore a surface resistance value was not obtained, measurement was then performed by the following method.

Using a high resistivity meter (Hiresta-UP MCP-HT450 made by Mitsubishi Chemical (K.K.)) with a ring type probe (URS Probe MCP-HTP14 made by Mitsubishi Chemical (K.K.)) connected, a central portion of each sample of 100 mm×100 mm was subjected to measurement in a double-ring method. With respect to 5 samples, an average value was calculated, and the calculated value was determined as a surface resistance value $R_0$ [Ω/□]. Incidentally, in the present invention, a range of the surface resistance value that can be practically employed was determined as being less than or equal to $1×10^8$ [Ω/□], and the surface resistance values less than or equal to this value were determined as being passed.

(5) Total Light Transmittance

Using a turbidity meter (opaque meter) NDH2000 (made by NIPPON DENSHOKU INDUSTRIES (K.K.)), the total light transmittance in the thickness direction of the electro-conductive stack body, with light incident from the electro-conductive layer side, on the basis of JIS K7361-1:1997. Measurement was performed with respect to 5 samples, and an average value for the 5 samples, and was determined as a total light transmittance of a corresponding level. In this measurement, a magnification power that allows one significant digit to be secured is selected, and in the calculation, the second digit was rounded off to find a value. Incidentally, in this present invention, the total light transmittance in a range greater than or equal to 76.5%, which is a range that can be practically employed, was determined as being passed.

(6) Durability

The surface resistance value $R_0$ found in (4) was determined as an initial surface resistance value. Next, 5 samples were subjected to a 24-hour accelerated test in a high-temperature and high-humidity condition of 60° C. in temperature and 90% RH in humidity, in a thermostat Perfect Oven (PH-400 made by ESPEC (K.K.)). After the accelerated test, the surface resistance values were measured with respect to the 5 samples, in the same manner as before the accelerated test. An average value for the 5 samples was calculated, and was determined as a post-heating surface resistance value R. As a change in the surface resistance value from before to after the heating, a ratio $R/R_0$ between the initial surface resistance value $R_0$ and the post-heating surface resistance value R was found. Incidentally, $R/R_0$ being greater than or equal to 1.0 and being closer to 1.0 means that the durability is accordingly higher and electroconductivity is maintained. The durability being the highest means that there is no change in the surface resistance value from before to after the heating, that is, $R/R_0$ is 1.0. Conversely, $R/R_0$ being greater means that the durability against heat is correspondingly lower. Incidentally, in the present invention, the range of $R/R_0$ that can be practically used is determined as being less than or equal to 2.0, and the durability less than or equal to the value is determined as being passed.

[Material]

<Substrate>

The substrates used in Examples and Comparative Examples are shown below.

(1) Substrate A

Polyethylene terephthalate film ("Lumirror" (registered trademark) T60 made by Toray (K.K.)).

Thickness of 125 μm

No hydrophilic layers (2) Substrate BA Hydrophilic Substrate in which a Polyester-Based Resin Hydrophilic Layer is Stacked on Each of Both Surfaces of the Substrate A.

125 μm in thickness

Polyester-based resin hydrophilic

The <polyester resin (a1)> mentioned below and the <polyester resin (a2)> mentioned below were mixed at a mass ratio of 1:1 to obtain a<polyester resin (A)>. Subsequently, a hydrophilic layer-purposed composition containing 100 mass parts of the foregoing <polyester resin (A)> and 50 mass parts of the <melamine-based crosslinking agent (B)> mentioned below was obtained. This hydrophilic layer-purposed composition was stacked to a thickness of 0.1 μm (on each side surface, which always applies below unless otherwise specified) on the substrate A, whereby a substrate B was obtained.

<Polyester Resin (a1)>

The component ratio (i)/(ii)/(iii)/(iv) mentioned below=12/76/12/100 [mol %]
  (i) 5-sodium sulfoisophthalic acid (compound having a hydrophilic group)
  (ii) 2,6-naphthalene dicarboxylic acid (compound having a hydrophilic group)
  (iii) trimellitic acid (compound having a hydrophilic group)
  (iv) ethylene glycol <Polyester Resin (a2)>

The component ratio (i)/(ii)/(iii)=76/24/100[mol %]
  (i) terephthalic acid (compound having a hydrophilic group)
  (ii) trimellitic acid (compound having a hydrophilic group)
  (iii) ethylene glycol <Melamine-Based Crosslinking Agent (B)>

Methylolated melamine resin (3) Substrate C

Hydrophilic substrate having an acryl-based resin hydrophilic layer mentioned below on both side surfaces of the substrate A.

Thickness of 125 μm

Acryl-based resin hydrophilic layer

A hydrophilic layer-purposed composition containing 100 mass parts of the <acrylic resin (A)> mentioned below and 50 mass parts of the <melamine-based crosslinking agent (B)> mentioned below. This hydrophilic layer-purposed composition was stacked to a thickness of 0.1 μm on the substrate A, whereby a substrate C was obtained.

<Acrylic Resin (a)>

The component ratio (i)/(ii)/(iii)/(iv)/(v)=55/38/3/2/2 [mol %]
  (i) methyl methacrylate
  (ii) ethyl acrylate
  (iii) N-methylol acrylamide
  (iv) 2-hydroxy ethyl methacrylate (compound having a hydrophilic group)
  (v) acrylic acid (compound having a hydrophilic group)

<Melamine-Based Crosslinking Agent (B)>

Methylolated melamine resin

<Electroconductive Material>

Various electroconductive materials in the various examples and comparative examples will be shown below.

(1) Electroconductive Material A "Silber Nanowire"

A silver nanowire electroconductive material (short axis: 50 to 100 nm, long axis: 20 to 40 μm).

(2) Electroconductive Material B "Copper Nanowire"

A copper nanowire electroconductive material (short axis: 10 to 20 nm, long axis: 1 to 100 μm) obtained by a method described in Production Example 1 and Example 2 in Japanese Patent Application Publication No. 2002-266007.

(3) Electroconductive Material C "Sliver Nanowire/Copper Nanowire Mixed Electroconductive Material"

A sliver nanowire/copper nanowire mixed electroconductive material obtained by mixing the electroconductive material A "sliver nanowire" and the electroconductive material B "copper nanowire" so that a mass ratio of 6:4 was obtained.

(4) Electroconductive Material D "Acicular Silicon Dioxide-Based/Ato (Antimony-Doped Tin Oxide) Composite Compound Electroconductive Material"

An acicular shaped silicon dioxide-based/ATO (antimony-doped tin oxide) composite compound ("DENTALL" (registered trademark) TM100 made by Otsuka Chemical (K.K.), short axis: 700 to 900 nm, long axis: 15 to 25 µm) electroconductive material.

<Matrix, Additive>

Materials used for the matrixes and additives in the various examples and comparative examples are shown below.

(1) Matrix Material A

An acryl-based composition "Fullcure" (registered trademark) HC-6 made by (Soken Chemical & Engineering (K.K.), a solid content concentration of 51 mass %) containing a compound having two or more carbon-carbon double bond groups that contribute to a polymerization reaction as an acryloyl group.

(2) Additive A

A compound having in its molecule a structure of structural expression (1) (Zonyl FSA made by U.S. DuPont company).

Example 1

As an aqueous dispersion liquid containing the electroconductive material A, a sliver nanowire dispersion liquid ("ClearOhm" (registered trademark) Ink-A AQ made by U.S. Cambrios company) was used. This sliver nanowire dispersion liquid was diluted so that the concentration of the sliver nanowire was 0.042 mass %, whereby a sliver nanowire-dispersed coating liquid was prepared.

Subsequently, this sliver nanowire-dispersed coating liquid (electroconductive composition) was applied to a side surface of the substrate A by using a Bar Coater No. 8 made by MATSUO SANGYO (K.K.), and hot air of 120° C. was caused to strike the surface on which the liquid had been applied, from a direction of 30° relative to the direction of application, for 60 seconds, to heat and dry the liquid, so that an electroconductive layer was formed. This product was determined as an electroconductive stack body.

Example 2

A sliver nanowire-dispersed coating liquid as in Example 1 in which the concentration of the sliver nanowire was 0.042 mass % was prepared. Into this sliver nanowire-dispersed coating liquid, the additive A was mixed so that the component amount of the additive A was 65 mass parts relative to 100 mass parts of the silver nanowire, whereby a sliver nanowire/additive mixed dispersion liquid was obtained.

Subsequently, this sliver nanowire/additive mixed dispersion liquid (electroconductive composition) was applied to a side surface of the substrate A by using a Bar Coater No. 8 made by MATSUO SANGYO (K.K.), and hot air of 120° C. was caused to strike the surface on which the liquid had been applied, from a direction of 30° relative to the direction of application, for 60 seconds, to heat and dry the liquid, so that an electroconductive layer was formed. This product was determined as an electroconductive stack body. Since this electroconductive stack body contained in the electroconductive layer a compound having the structure of structural expression (1) in its molecule, the average value A and the variation deviation σ of the opening areas decreased, and the surface resistance value declined in comparison with Example 1, which did not contain the compound.

Example 3

The sliver nanowire/additive mixed dispersion liquid in Example 2 was prepared.

Subsequently, this sliver nanowire/additive mixed dispersion liquid (electroconductive composition) was applied to a side surface of the substrate B by using a Bar Coater No. 9 made by MATSUO SANGYO (K.K.), and hot air of 120° C. was caused to strike the surface on which the liquid had been applied, from a direction of 30° relative to the direction of application, for 60 seconds, to heat and dry the liquid, so that an electroconductive layer was formed. This product was determined as an electroconductive stack body. Since in this electroconductive stack body, the electroconductive layer was formed on the hydrophilic substrate, the average value A and the variation deviation σ of opening areas decreased, and the surface resistance value declined in comparison with Example 2, which used the substrate A without a hydrophilic layer.

Example 4

An electroconductive layer was formed to obtain an electroconductive stack body in substantially the same manner as in Example 3, except that hot air of 80° C. was caused to strike the surface on which the liquid had been applied, from a direction of 90° relative to the direction of application, for 60 seconds, to heat and dry the liquid, so that an electroconductive layer was formed. As for this electroconductive stack body, since the condition at the time of heating and drying was changed to a preferred condition, the average value A and the variation deviation σ of opening areas decreased, and the surface resistance value declined in comparison with Example 3, in which the condition was not changed so.

Example 5

The sliver nanowire/additive mixed dispersion liquid in Example 2 was prepared.

Subsequently, this sliver nanowire/additive mixed dispersion liquid (electroconductive composition) was applied to a side surface of the substrate C by using a Bar Coater No. 10 made by MATSUO SANGYO (K.K.), and hot air of 80° C. was caused to strike the surface on which the liquid had been applied, from a direction of 90° relative to the direction of application, for 60 seconds, to heat and dry the liquid, so that an electroconductive layer was formed. This product was determined as an electroconductive stack body. As for this electroconductive stack body, since the No. of the bar coater was changed and the amount of application of the sliver nanowire/additive mixed dispersion liquid (electroconductive composition) was changed, the average value A and the variation deviation σ of opening areas decreased, and the surface resistance value declined in comparison with Example 4, which was without these changes.

Example 6

An electroconductive layer was formed in substantially the same manner as in Example 5, except that the substrate B was used, and then the product was determined as an electroconductive stack body. As for this electroconductive stack body, since the kind of the hydrophilic substrate was changed, the average value A and the variation deviation σ of opening areas decreased, and the surface resistance value declined in comparison with Example 5, which used the substrate C, whose hydrophilic layer was different.

Example 7

The sliver nanowire/additive mixed dispersion liquid in Example 2 was prepared.

Subsequently, this sliver nanowire/additive mixed dispersion liquid (electroconductive composition) was applied to a side surface of the substrate C by using a Bar Coater No. 12 made by MATSUO SANGYO (K.K.), and hot air of 80° C. was caused to strike the surface on which the liquid had been applied, from a direction of 90° relative to the direction of application, for 60 seconds, to heat and dry the liquid, so that an electroconductive layer was formed. This product was determined as an electroconductive stack body. As for this electroconductive stack body, since the No. of the bar coater was changed and the amount of application of the sliver nanowire/additive mixed dispersion liquid (electroconductive composition) was changed, the average value A and the variation deviation σ of opening areas decreased, and the surface resistance value declined in comparison with Example 5, which was without these changes.

Example 8

An electroconductive layer was formed in substantially the same manner as in Example 7, except that the substrate B was used, and then the product was determined as an electroconductive stack body. As for this electroconductive stack body, since the kind of the hydrophilic substrate was changed, the average value A and the variation deviation σ of opening areas decreased, and the surface resistance value declined in comparison with Example 7, which used the substrate C, whose hydrophilic layer was different.

Example 9

The sliver nanowire/additive mixed dispersion liquid in Example 2 was prepared.

Subsequently, this sliver nanowire/additive mixed dispersion liquid (electroconductive composition) was applied to a side surface of the substrate B by using a Bar Coater No. 14 made by MATSUO SANGYO (K.K.), and hot air of 80° C. was caused to strike the surface on which the liquid had been applied, from a direction of 90° relative to the direction of application, for 60 seconds, to heat and dry the liquid, so that an electroconductive layer was formed. This product was determined as an electroconductive stack body. As for this electroconductive stack body, since the No. of the bar coater was changed and the amount of application of the sliver nanowire/additive mixed dispersion liquid (electroconductive composition) was changed, the average value A and the variation deviation σ of opening areas decreased, and the surface resistance value declined in comparison with Example 8, which was without these changes.

Example 10

The sliver nanowire/additive mixed dispersion liquid in Example 2 was prepared.

Subsequently, this sliver nanowire/additive mixed dispersion liquid (electroconductive composition) was applied to a side surface of the substrate B by using a Bar Coater No. 16 made by MATSUO SANGYO (K.K.), and hot air of 80° C. was caused to strike the surface on which the liquid had been applied, from a direction of 90° relative to the direction of application, for 60 seconds, to heat and dry the liquid, so that an electroconductive layer was formed. This product was determined as an electroconductive stack body. As for this electroconductive stack body, since the No. of the bar coater was changed and the amount of application of the sliver nanowire/additive mixed dispersion liquid (electroconductive composition) was changed, the average value A and the variation deviation σ of opening areas decreased, and the surface resistance value declined in comparison with Example 9, which was without these changes.

Example 11

The sliver nanowire/additive mixed dispersion liquid in Example 2 was prepared.

Subsequently, this sliver nanowire/additive mixed dispersion liquid (electroconductive composition) was applied to a side surface of the substrate B by using a Bar Coater No. 20 made by MATSUO SANGYO (K.K.), and hot air of 80° C. was caused to strike the surface on which the liquid had been applied, from a direction of 90° relative to the direction of application, for 90 seconds, to heat and dry the liquid, so that an electroconductive layer was formed. This product was determined as an electroconductive stack body. As for this electroconductive stack body, since the No. of the bar coater was changed and the amount of application of the sliver nanowire/additive mixed dispersion liquid (electroconductive composition) and, furthermore, the drying time were changed, the average value A and the variation deviation σ of opening areas decreased, and the surface resistance value declined in comparison with Example 10, which was without these changes.

Example 12

The sliver nanowire/additive mixed dispersion liquid in Example 2 was prepared.

Subsequently, this sliver nanowire/additive mixed dispersion liquid (electroconductive composition) was applied to a side surface of the substrate B by using a Bar Coater No. 24 made by MATSUO SANGYO (K.K.), and hot air of 80° C. was caused to strike the surface on which the liquid had been applied, from a direction of 90° relative to the direction of application, for 120 seconds, to heat and dry the liquid, so that an electroconductive layer was formed. This product was determined as an electroconductive stack body. As for this electroconductive stack body, since the No. of the bar coater was changed and the amount of application of the sliver nanowire/additive mixed dispersion liquid (electroconductive composition) and, furthermore, the drying time were changed, the average value A and the variation deviation σ of opening areas decreased, and the surface resistance value declined in comparison with Example 11, which was without these changes.

Example 13

The sliver nanowire/additive mixed dispersion liquid in Example 2 was prepared.

Subsequently, this sliver nanowire/additive mixed dispersion liquid (electroconductive composition) was applied to a side surface of the substrate B by using a Bar Coater No. 28 made by MATSUO SANGYO (K.K.), and hot air of 80° C. was caused to strike the surface on which the liquid had been applied, from a direction of 90° relative to the direction of application, for 120 seconds, to heat and dry the liquid, so that an electroconductive layer was formed. This product was determined as an electroconductive stack body. As for this electroconductive stack body, since the No. of the bar coater was changed and the amount of application of the sliver nanowire/additive mixed dispersion liquid (electroconductive composition) was changed, the average value A and the variation deviation σ of opening areas decreased, and the surface resistance value declined in comparison with Example 12, which was without these changes.

Example 14

The electroconductive material D was used, and mixed with, as a binder component, an acryl-based resin ("Phoret" (registered trademark) GS-1000, with a solid content concentration of 30 mass %) made by Soken Chemical & Engineering (K.K.)) so that the electroconductive material was present at 60 mass % relative to the entire solid content (solid content mixture ratio:binder component/electroconductive material=40 mass %/60 mass %). Subsequently, ethyl acetate was added to this mixture liquid so that the coating material solid content concentration was 50 mass %, whereby an acicular silicon dioxide-based/ATO (antimony-doped tin oxide) composite compound dispersion liquid was obtained.

Subsequently, this acicular silicon dioxide-based/ATO (antimony-doped tin oxide) composite compound dispersion liquid was applied to a side surface of the substrate B by using a slit die coating equipped with a shim whose material was SUS (shim thickness of 100 μm), and hot air of 120° C. was caused to strike the surface on which the liquid had been applied, from a direction of 30° relative to the direction of application, for 300 seconds, so as to heat and dry the liquid, so that an electroconductive layer was formed. This product was determined as an electroconductive stack body. As for this electroconductive stack body, since the electroconductive material was changed from those in Example 1 to 13, it became possible to adjust the surface resistance value and the optical property.

Example 15

An electroconductive layer was formed as in Example 14, except that hot air of 80° C. was caused to strike the surface on which the lead had been applied, from a direction of 90° relative to the direction of application, for 300 seconds, to heat and dry the liquid. This product was determined as being an electroconductive stack body. This electroconductive stack body, despite using the electroconductive material different from those in Examples 1 to 13, obtained an effect of decreasing the average value A and the variation deviation σ of opening areas by changing the conditions at the time of heating and drying to preferred conditions, and the surface resistance value declined in comparison with Example 14, which was without these changes.

Example 16

A copper nanowire dispersion liquid was obtained in substantially the same manner as in Example 1, except that the electroconductive material B was used. Subsequently, the same sliver nanowire-dispersed coating liquid as in Example 1 and a copper nanowire-dispersed coating liquid were mixed so that the mass ratio was the sliver nanowire-dispersed coating liquid:the copper nanowire-dispersed coating liquid=6:4, whereby a sliver nanowire/copper nanowire mixed electroconductive material-dispersed coating liquid was obtained.

Subsequently, this sliver nanowire/copper nanowire mixed electroconductive material-dispersed coating liquid (mixed electroconductive composition) was applied to a side surface of the substrate B by using a Bar Coater No. 9 made by MATSUO SANGYO (K.K.), and hot air of 120° C. was caused to strike the surface on which the liquid had been applied, from a direction of 30° relative to the direction of application, for 60 seconds, to heat and dry the liquid, so that an electroconductive layer was formed. This product was determined as an electroconductive stack body. As for this electroconductive stack body, since the electroconductive material different from the electroconductive materials in Examples 1 to 13, adjustment of the surface resistance value and the optical property became possible.

Example 17

The same sliver nanowire/additive mixed dispersion liquid as in Example 2 and the same copper nanowire dispersion liquid as in Example 16 were mixed so that the mass ratio was the sliver nanowire/additive mixed dispersion liquid:the copper nanowire-dispersed coating liquid=6:4, whereby a sliver nanowire/copper nanowire/additive mixed electroconductive material-dispersed coating liquid was obtained.

Subsequently, this sliver nanowire/copper nanowire/additive mixed electroconductive material-dispersed coating liquid (mixed electroconductive composition) was applied to a side surface of the substrate B by using a Bar Coater No. 9 made by MATSUO SANGYO (K.K.), and hot air of 80° C. was caused to strike the surface on which the liquid had been applied, from a direction of 90° relative to the direction of application, for 60 seconds, to heat and dry the liquid, so that an electroconductive layer was formed. This product was determined as an electroconductive stack body. This electroconductive stack body, despite using the substantially the same mixed electroconductive material as in Example 16, obtained an effect of decreasing the average value A and the variation deviation σ of opening areas by containing in the electroconductive layer a compound having the structure of structural expression (1) in its molecule and, furthermore, changing the conditions at the time of heating and drying to preferred conditions, and the surface resistance value declined in comparison with Example 16, which was without these changes.

Example 18

50.0 g of matrix material A and 2268 g of ethyl acetate were mixed and stirred to prepare a matrix composition Subsequently, the matrix composition was applied to the electroconductive layer side of Example 8, by using a slit die coating equipped with a shim whose material was SUS (shim thickness of 50 μm), and was dried at 120° C. for 2 minutes, and then was irradiated with ultraviolet ray at 80 mJ/cm$^2$, so that an electroconductive layer containing a matrix whose matrix thickness was 120 nm was formed. This product was determined as an electroconductive stack body. Because the electroconductive layer contained a matrix, durability improved in comparison with the Example 8.

Example 19

An electroconductive layer containing a matrix whose matrix thickness was 120 nm was formed on the electroconductive layer side in Example 13 in substantially the same manner as in Example 18. This product was determined as an electroconductive stack body. Because the electroconductive layer contained a matrix, durability improved in comparison with the Example 13.

Comparative Example 1

The substrate B was not provided with an electroconductive layer, but only the substrate was used.

Comparative Example 2

As an aqueous dispersion liquid containing the electroconductive material A, a sliver nanowire dispersion liquid (ClearOhm Ink-A AQ made by U.S. Cambrios company) was prepared. Using this sliver nanowire dispersion liquid, a sliver nanowire-dispersed coating liquid was arranged so that the concentration of the sliver nanowire was 0.0084 mass % (the amount of the sliver nanowire was ⅕ in comparison with Example 1).

Subsequently, this sliver nanowire-dispersed coating liquid (electroconductive composition) was applied to a side surface of the substrate B by using a Bar Coater No. 9 made by MATSUO SANGYO (K.K.), and hot air of 80° C. was caused to strike the surface on which the liquid had been applied, from a direction of 90° relative to the direction of application, for 60 seconds, to heat and dry the liquid, so that an electroconductive layer was formed. In the coating layer of the electroconductive material obtained in these conditions, the sliver nanowire did not have a network structure, and the stack body in this comparative example did not exhibit electroconductivity. Therefore, evaluation of the average value A and the variation deviation σ of opening areas were not carried out.

Comparative Example 3

As an aqueous dispersion liquid containing the electroconductive material A, a sliver nanowire dispersion liquid (ClearOhm Ink-A AQ made by U.S. Cambrios company) was prepared. Using this sliver nanowire dispersion liquid, a sliver nanowire-dispersed coating liquid was arranged so that the concentration of the sliver nanowire was 0.0042 mass % (the amount of silver nanowire was 1/10 in comparison with Example 1).

Subsequently, this sliver nanowire-dispersed coating liquid (electroconductive composition) was applied to a side surface of the substrate A by using a Bar Coater No. 80 made by MATSUO SANGYO (K.K.), and hot air of 180° C. was caused to strike the surface on which the liquid had been applied, from a direction of 30° relative to the direction of application, for 600 seconds, to heat and dry the liquid, so that an electroconductive layer was formed. This product was determined as an electroconductive stack body.

In the coating layer of the electroconductive material obtained in these conditions, the sliver nanowire had a network structure. However, in the electroconductive stack body of this comparative example, the average value A and the variation deviation σ of the opening areas of the opening portions in the network structure were both large values, and the electroconductive stack body was high in surface resistance value and low in electroconductivity, in comparison with the electroconductive stack bodies of the examples that used sliver nanowire.

Comparative Example 4

As an aqueous dispersion liquid containing the electroconductive material A, a sliver nanowire dispersion liquid (ClearOhm Ink-A AQ made by U.S. Cambrios company) was prepared. Using this sliver nanowire dispersion liquid, a sliver nanowire-dispersed coating liquid was arranged so that the concentration of the sliver nanowire was 0.0084 mass % (the amount of silver nanowire was ⅕ in comparison with Example 1).

Subsequently, this sliver nanowire-dispersed coating liquid (electroconductive composition) was applied to a side surface of the substrate A by using a Bar Coater No. 50 made by MATSUO SANGYO (K.K.), and hot air of 180° C. was caused to strike the surface on which the liquid had been applied, from a direction of 90° relative to the direction of application, for 600 seconds, to heat and dry the liquid, so that an electroconductive layer was formed. This product was determined as an electroconductive stack body.

In the coating layer of the electroconductive material obtained in these conditions, the sliver nanowire had a network structure. However, in the electroconductive stack body of this comparative example, the variation deviation σ of the opening areas of the opening portions in the network structure was a large value, and the electroconductive stack body was high in surface resistance value and low in electroconductivity in comparison with the electroconductive stack bodies of the examples that used sliver nanowire.

Comparative Example 5

An electroconductive layer was formed in substantially the same manner as in Comparative Example 4, except that using a Bar Coater No. 40 made by MATSUO SANGYO (K.K.), the liquid was applied to a side surface of the substrate A, and hot air of 80° C. was caused to strake the surface on which the liquid had been applied, in a direction of 90° relative to the direction of application, for 600 seconds, to heat and dry the liquid. This product was determined as an electroconductive stack body.

In the coating layer of the electroconductive material obtained in these conditions, the sliver nanowire had a network structure. However, in the electroconductive stack body of this comparative example, the average value A of the opening areas of the opening portions in the network structure was a large value, and the electroconductive stack body was high in surface resistance value and low in electroconductivity in comparison with the electroconductive stack bodies of the examples that used sliver nanowire.

Comparative Example 6

The sliver nanowire-dispersed coating liquid in Comparative Example 4 in which the concentration of the sliver nanowire was 0.0084 mass % (the amount of silver nanowire was ⅕ in comparison with Example 1). Into this sliver nanowire-dispersed coating liquid, the additive A was mixed so that the component amount of the additive A was 86 mass parts relative to 100 mass parts of the silver nanowire, whereby a sliver nanowire/additive mixed dispersion liquid was obtained.

Subsequently, this sliver nanowire/additive mixed dispersion liquid (electroconductive composition) was applied to a side surface of the substrate A by using a Bar Coater No. 50 made by MATSUO SANGYO (K.K.), and hot air of 150° C. was caused to strike the surface on which the liquid had been applied, from a direction of 150° relative to the direction of application, for 600 seconds, to heat and dry the liquid, so that an electroconductive layer was formed. This product was determined as an electroconductive stack body.

In the coating layer of the electroconductive material obtained in these conditions, the sliver nanowire had a network structure. However, in the electroconductive stack body of this comparative example, the variation deviation σ of the opening areas of the opening portions in the network structure was a large value, and the electroconductive stack body was high in surface resistance value and low in electroconductivity in comparison with the electroconductive stack bodies of the examples that used sliver nanowire.

Comparative Example 7

Without using the acryl-based resin, which was a binder component in Example 14, water was added for concentration adjustment so that the concentration of the electroconductive material D became the same concentration as in Example 14, whereby an acicular silicon dioxide-based/ATO (antimony-doped tin oxide) composite compound dispersion liquid was obtained.

Subsequently, this acicular silicon dioxide-based/ATO (antimony-doped tin oxide) composite compound dispersion liquid was applied to a side surface of the substrate A by using a slit die coating equipped with a shim whose material was SUS (shim thickness of 100 μm), and hot air of 150° C. was caused to strike the surface on which the liquid had been applied, from a direction of 0° relative to the direction of application, for 300 seconds, to heat and dry the liquid, so that an electroconductive layer was formed. This product was determined as an electroconductive stack body.

In the coating layer of the electroconductive material obtained in these conditions, the acicular silicon dioxide-based/ATO (antimony-doped tin oxide) composite compound had a network structure. However, in the electroconductive stack body of this comparative example, the average value A and the variation deviation σ of the opening areas of the opening portions in the network structure were both large values, and the electroconductive stack body was high in surface resistance value and low in electroconductivity in comparison with the electroconductive stack bodies of the examples that used the acicular silicon dioxide-based/ATO (antimony-doped tin oxide) composite compound.

TABLE 1

| | Substrate | | Electroconductive layer | | | | Compound having structure of structural formula 1 in molecule |
|---|---|---|---|---|---|---|---|
| | Substrate | Presence/Absence of hydrophilic layer | Electroconductive material | Electroconductive component | | | |
| | | | | Component | Shape | State | |
| Example 1 | A | Absent | A | Silver | Nanowire | Network | Absent |
| Example 2 | A | Absent | A | Silver | Nanowire | Network | Present |
| Example 3 | B | Present | A | Silver | Nanowire | Network | Present |
| Example 4 | B | Present | A | Silver | Nanowire | Network | Present |
| Example 5 | C | Present | A | Silver | Nanowire | Network | Present |
| Example 6 | B | Present | A | Silver | Nanowire | Network | Present |
| Example 7 | C | Present | A | Silver | Nanowire | Network | Present |
| Example 8 | B | Present | A | Silver | Nanowire | Network | Present |
| Example 9 | B | Present | A | Silver | Nanowire | Network | Present |
| Example 10 | B | Present | A | Silver | Nanowire | Network | Present |
| Example 11 | B | Present | A | Silver | Nanowire | Network | Present |
| Example 12 | B | Present | A | Silver | Nanowire | Network | Present |
| Example 13 | B | Present | A | Silver | Nanowire | Network | Present |
| Example 14 | B | Present | D | Silicon dioxide-based/ATO composite compound | Acicular | Network | Absent |
| Example 15 | B | Present | D | Silicon dioxide-based/ATO composite compound | Acicular | Network | Absent |
| Example 16 | B | Present | C | Silver Copper | Nanowire Nanowire | Network | Absent |
| Example 17 | B | Present | C | Silver Copper | Nanowire Nanowire | Network | Present |

| | Electroconductive layer | | | | | |
|---|---|---|---|---|---|---|
| | Drying step | | Opening portion formed by network structure | | Surface resistance value $R_0$ [Ω/□]X | Total light transmittance [%] |
| | Direction of air stream [deg] | Temperature [° C.] | Average value A [μ²m] | Variation deviation σ [μm²] | | |
| Example 1 | 30 | 120 | 18.9 | 25.1 | 611 | 91.0 |
| Example 2 | 30 | 120 | 13.4 | 25.0 | 353 | 91.0 |
| Example 3 | 30 | 120 | 11.9 | 24.8 | 330 | 90.9 |
| Example 4 | 90 | 80 | 10.7 | 24.7 | 299 | 90.9 |
| Example 5 | 90 | 80 | 10.3 | 17.8 | 250 | 90.8 |
| Example 6 | 90 | 80 | 7.8 | 16.3 | 197 | 90.9 |
| Example 7 | 90 | 80 | 6.8 | 14.9 | 184 | 90.9 |
| Example 8 | 90 | 80 | 6.2 | 11.3 | 131 | 90.9 |
| Example 9 | 90 | 80 | 5.2 | 9.4 | 93 | 90.8 |
| Example 10 | 90 | 80 | 4.6 | 7.6 | 79 | 90.8 |
| Example 11 | 90 | 80 | 3.5 | 4.9 | 52 | 90.6 |
| Example 12 | 90 | 80 | 3.0 | 3.6 | 39 | 90.5 |
| Example 13 | 90 | 80 | 2.7 | 2.9 | 31 | 90.4 |
| Example 14 | 30 | 120 | 19.5 | 25.0 | $1.0 \times 10^7$ | 76.5 |
| Example 15 | 90 | 80 | 17.9 | 21.2 | $2.9 \times 10^6$ | 76.6 |
| Example 16 | 30 | 120 | 11.1 | 19.8 | 526 | 86.3 |
| Example 17 | 90 | 80 | 9.1 | 15.6 | 455 | 86.2 |

TABLE 2

| | Matrix of electroconductive layer | Durability (R/R₀) |
|---|---|---|
| Example 8 | Absent | 2.0 |
| Example 13 | Absent | 1.7 |
| Example 18 | Present | 1.0 |
| Example 19 | Present | 1.0 | changing the forming method for the electroconductive layer as in Examples 9 to 13, it was possible to not only further lower the surface resistance value and further improve the electroconductivity, but it also became possible to adjust the optical property (total light transmittance).

Examples 14 and 15 in which the component of the electroconductive layer was not sliver nanowire and Examples 16 and 17 that used an electroconductive layer in which sliver nanowire and a linear structural body other than sliver nanowire were mixed gave inferior results in surface resistance

TABLE 3

| | Substrate | | Electroconductive layer | | | | |
|---|---|---|---|---|---|---|---|
| | Substrate | Presence/Absence of hydrophilic layer | Electroconductive component | | | | Compound having structure of structural formula 1 in molecule |
| | | | Electroconductive material | Component | Shape | State | |
| Comparative Example 1 | B | Present | — | — | — | — | — |
| Comparative Example 2 | B | Present | A | Silver | Nanowire | Non-network | Present |
| Comparative Example 3 | A | Absent | A | Silver | Nanowire | Network | Absent |
| Comparative Example 4 | A | Absent | A | Silver | Nanowire | Network | Absent |
| Comparative Example 5 | A | Absent | A | Silver | Nanowire | Network | Absent |
| Comparative Example 6 | A | Absent | A | Silver | Nanowire | Network | Present |
| Comparative Example 7 | A | Absent | D | Silicon dioxide-based/ATO composite compound | Acicular | Network | Absent |

| | Electroconductive layer | | | | | |
|---|---|---|---|---|---|---|
| | Drying step | | Opening portion formed by network structure | | | |
| | Direction of air stream [deg] | Temperature [° C.] | Average value A [$\mu^2$m] | Variation deviation $\sigma$ [$\mu m^2$] | Surface resistance value $R_0$ [$\Omega/\square$]X | Total light transmittance [%] |
| Comparative Example 1 | 90 | 80 | — | — | Unmeasurable | 91.3 |
| Comparative Example 2 | 30 | 180 | — | — | Unmeasurable | 91.1 |
| Comparative Example 3 | 90 | 180 | 21.3 | 26.2 | 1081 | 90.9 |
| Comparative Example 4 | 90 | 80 | 19.3 | 27.3 | 1069 | 90.6 |
| Comparative Example 5 | 150 | 150 | 22.2 | 24.5 | 1073 | 90.7 |
| Comparative Example 6 | 0 | 150 | 19.5 | 28.2 | 1077 | 90.5 |
| Comparative Example 7 | | | 29.1 | 29.8 | $7.8 \times 10^{10}$ | 76.2 |

In any one of the examples, an electroconductive stack body exhibiting good electroconductivity was obtained. The electroconductivity was even better than in Example 1 in the case where, as in Example 2, the electroconductive layer further contains a compound having in its molecule the structure of structural expression (1), together with the linear structural body, the case where, as in Example 3, a substrate further having a hydrophilic layer was applied, and the case where, as in Example 4, the desiccation step employed a preferred condition. By changing the kind of the hydrophilic substrate as in Examples 5 and 6 and Examples 7 and 8, or value and optical property in comparison with Examples 1 to 13, which used an electroconductive layer made only of sliver nanowire.

Furthermore, even among the cases where the electroconductive layer was formed from a similar electroconductive material (linear structural body), the cases where, as in Examples 18 and 19, the electroconductive layer further contained a high-molecular matrix improved in durability, in comparison with the cases where, as in Examples 8 and 13, an electroconductive layer that did not contain a high-molecular matrix was used.

In the case where an electroconductive layer is not provided (Comparative Example 1) or the case that did not have a network structure despite containing an electroconductive component made up of a linear structural body (Comparative Example 2), electroconductivity is not exhibited. In the cases where as for the network structure of the electroconductive layer, the variation deviation σ of opening areas is a large value as in Comparative Examples 4 and 6 or cases where the average value A of opening areas is a large value as in Comparative Example 5, electroconductive stack bodies with low electroconductivity resulted even if sliver nanowire, being an electroconductive material (linear structural body) good in electroconductivity, was used. In particular, in the cases where the average value A and the variation deviation σ of opening areas were large values as in Comparative Example 3 and Comparative Example 7, the electroconductivity was extremely low with any kind of electroconductive material (linear structural body).

The electroconductive stack body of the present invention, being good in electroconductivity, is preferably employable for uses in touch panels. Furthermore, the electroconductive stack body of the present invention can also be preferably employed also in electrode members for use in display-related devices, such as liquid crystal displays, organic electroluminescence (organic EL), electronic paper, etc., and also solar cell modules, etc.

DESCRIPTION OF REFERENCE CHARACTERS

1: substrate
2: hydrophilic substrate
3: hydrophilic layer
4: electroconductive layer
5: electroconductive surface observed in a direction perpendicular to the stacking surface
6: single fibrous electroconductive body (an example of the linear structural body)
7: aggregate of fibrous electroconductive bodies (an example of the linear structural body)
8: nanowire (an example of the linear structural body)
9: acicular electroconductive body such as whisker (an example of the linear structural body)
10: matrix
11: contact formed by overlaps of fibrous electroconductive bodies
12: contact point formed by overlaps of nanowires
13: contact point formed by overlaps of acicular electroconductive bodies such as whisker
14: linear structural body having a network structure
15: opening portion formed by the network structure of a linear structural body
16: electroconductive stack body incorporated in a touch panel
17: hydrophilic substrate of the electroconductive stack body incorporated in the touch panel
18: electroconductive layer of the electroconductive stack body incorporated in the touch panel
19: junction layer for stacking the electroconductive stack body by an adhesive or a tackiness agent
20: substrate on the touch panel screen side
21: hard coat layer stacked on the touch panel screen side substrate
22: electroconductive layer surface
23: single linear structural body
24: single linear structural body present as an aggregate
25: aggregate made up of linear structural bodies
26: diameter r of a single linear structural body
27: diameter r of a linear structural body of the aggregate made up of linear structural bodies

The invention claimed is:

1. An electroconductive stack body having on at least one side surface of a substrate an electroconductive layer that has a network structure that is made by a linear structural body, wherein, regarding an opening portion that satisfies Expression (1) in an opening area of an opening portion that is formed by the network structure, average value A of the opening area is less than or equal to 20 μm² and variation deviation σ of the opening area defined by Expression (2) is less than or equal to 26 μm²:

$$X < X_{max} \times 0.9 \qquad \text{Expression (1)}$$

wherein X represents each opening area, and Xmax represents a maximum value of each opening area; and $$\sigma = \{\Sigma(X-A)^2)/N\}^{0.5} \text{ (where as for } \Sigma, i=1 \text{ to } N) \qquad \text{Expression (2)}$$

wherein X represents each of the opening areas of the opening portions that satisfy Expression (1), A represents the average value of the opening areas X of the opening portions that satisfy Expression (1), and N represents the total number of the opening portions that satisfy Expression (1).

2. The electroconductive stack body according to claim 1, wherein the linear structural body is a sliver nanowire.

3. The electroconductive stack body according to claim 1, wherein the electroconductive layer further includes a compound that has a structure of the following structural expression (1) in a molecule:

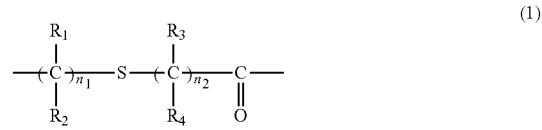

wherein Ra(a=1 to 4) represents H or F, and n1 and n2 each independently represent an integer of 1 to 10.

4. The electroconductive stack body according to claim 1, wherein the electroconductive layer further includes a high-molecular matrix.

5. The electroconductive stack body according to claim 1, wherein the substrate is a hydrophilic substrate in which a hydrophilic layer that includes a compound having a hydrophilic group is stacked on an outermost layer of at least one side surface.

6. A production method for the electroconductive stack body according to claim 1, wherein, in a step of forming an electroconductive layer by applying a water-containing dispersion liquid of a linear structural body onto a substrate and then drying the water-containing dispersion liquid, a drying step is a step of causing an air stream whose temperature is 25 to 120° C. to strike a surface on which the water-containing dispersion liquid has been applied, from a direction of 45 to 135° relative to a direction of application.

7. A display body including the electroconductive stack body according to claim 1.

8. A touch panel in which the display body according to claim 7 is incorporated.

9. An electronic paper in which the display body according to claim 7 is incorporated.

* * * * *